(12) United States Patent
Shi

(10) Patent No.: US 8,697,254 B2
(45) Date of Patent: Apr. 15, 2014

(54) CAVITY ELECTROLUMINESCENT DEVICES AND METHODS FOR PRODUCING THE SAME

(75) Inventor: Yijian Shi, Mountain View, CA (US)

(73) Assignee: SRI International, Menlo Park, CA (US)

( * ) Notice: Subject to any disclaimer, the term of this patent is extended or adjusted under 35 U.S.C. 154(b) by 1116 days.

(21) Appl. No.: 11/900,478

(22) Filed: Sep. 11, 2007

(65) Prior Publication Data

US 2008/0248240 A1     Oct. 9, 2008

Related U.S. Application Data

(60) Provisional application No. 60/859,072, filed on Nov. 14, 2006, provisional application No. 60/955,834, filed on Aug. 14, 2007.

(51) Int. Cl.
*H01L 51/54* (2006.01)

(52) U.S. Cl.
USPC ........... 428/690; 428/917; 313/504; 313/506; 252/301.16; 257/40; 257/88

(58) Field of Classification Search
None
See application file for complete search history.

(56) References Cited

U.S. PATENT DOCUMENTS

| | | | |
|---|---|---|---|
| 4,539,507 A | 9/1985 | VanSlyke et al. |
| 4,614,668 A | 9/1986 | Topp et al. |
| 5,086,297 A | 2/1992 | Miyake et al. |
| 5,247,190 A | 9/1993 | Friend et al. |
| 5,442,256 A | 8/1995 | Moyer et al. |
| 5,656,508 A | 8/1997 | So et al. |
| 5,677,546 A | 10/1997 | Yu |
| 5,682,043 A | 10/1997 | Pei et al. |
| 5,723,873 A | 3/1998 | Yang |
| 5,807,627 A | 9/1998 | Friend et al. |
| 5,869,350 A | 2/1999 | Heeger et al. |
| 5,895,717 A | 4/1999 | Cao et al. |
| 5,900,327 A | 5/1999 | Pei et al. |
| 5,962,631 A | 10/1999 | Woo et al. |
| 5,966,393 A | 10/1999 | Hide et al. |

(Continued)

FOREIGN PATENT DOCUMENTS

| | | |
|---|---|---|
| EP | 0776052 | 5/1997 |
| EP | 0878883 | 11/1998 |

(Continued)

OTHER PUBLICATIONS

Merriam-Webster Collegiate Dictionary, tenth edition, 1997, p. 612.*

(Continued)

*Primary Examiner* — Michael H Wilson
(74) *Attorney, Agent, or Firm* — Richard Aron Osman; Isaac Rutenberg

(57) ABSTRACT

Aspects of the invention include electroluminescent devices and methods for making the same. In certain embodiments, the devices include a substrate, a hole-injection electrode layer, a dielectric layer, an electroluminescent layer, an electron-injection electrode layer, and a cavity. In certain embodiments, an electrode layer (e.g., the electron-injection or hole-injection electrode layer) is positioned above the cavity and is configured for directing light through the substrate. In certain embodiments, an electrode layer (e.g., the electron-injection or hole-injection electrode layer) is positioned above and spans across the cavity. The use of the produced device(s) in electroluminescent displays is also provided herein.

53 Claims, 18 Drawing Sheets

(56) References Cited

U.S. PATENT DOCUMENTS

| | | | |
|---|---|---|---|
| 6,091,195 | A | 7/2000 | Forrest et al. |
| 6,326,936 | B1 | 12/2001 | Inganas et al. |
| 6,339,289 | B1 | 1/2002 | Fork |
| 6,414,104 | B1 | 7/2002 | Pei |
| 6,593,687 | B1 * | 7/2003 | Pei et al. ............ 313/504 |
| 6,723,828 | B2 | 4/2004 | Pei |
| 6,800,722 | B2 | 10/2004 | Pei |
| 6,856,089 | B2 | 2/2005 | Hosokawa et al. |
| 6,998,773 | B2 | 2/2006 | Hosokawa et al. |
| 7,098,297 | B2 | 8/2006 | Pei |
| 7,423,371 | B2 | 9/2008 | Hosokawa et al. |
| 2001/0026124 | A1 * | 10/2001 | Liu et al. ............ 313/504 |
| 2003/0218418 | A9 * | 11/2003 | Sato et al. ............ 313/504 |
| 2006/0105201 | A1 * | 5/2006 | Lee et al. ............ 428/690 |
| 2007/0031700 | A1 | 2/2007 | Guo et al. |
| 2008/0238310 | A1 | 10/2008 | Forrest et al. |
| 2008/0265757 | A1 | 10/2008 | Forrest et al. |
| 2009/0042142 | A1 | 2/2009 | Baldo et al. |
| 2011/0042657 | A1 | 2/2011 | Shi |

FOREIGN PATENT DOCUMENTS

| | | |
|---|---|---|
| EP | 0886329 | 12/1998 |
| EP | 0892028 | 1/1999 |
| EP | 0892590 | 1/1999 |
| EP | 1 104 939 | 6/2002 |
| EP | 1285957 | 2/2003 |
| EP | 1 385 219 | 1/2004 |
| GB | 2 361 355 | 10/2001 |
| WO | 9810473 | 3/1998 |
| WO | 9827136 | 6/1998 |
| WO | 9831057 | 7/1998 |
| WO | WO 99/08325 | 2/1999 |
| WO | 0106577 | 1/2001 |
| WO | WO 2008/060348 | 5/2008 |

OTHER PUBLICATIONS

Kaminorz et al. (2000), "Characteristics of Polythiophene Surface Light Emitting Diodes," *Synthetic Metals*, 113:103-114.

Nyberg et al. (2002), "Macromolecular Nanoelectronics," *Current Applied Physics*, 2:27-31.

Nyberg et al. (2002), "Submicrometre Bridge Electrode Arrays for Light Emitting Polymer Diodes and Photodiodes,"*Nanotechnology*, 13:205-211.

Pede et al. (1998), "A General-Purpose Conjugated-Polymer Device Array for Imaging," *Adv. Mater.*, 10(3):233-237.

Baigent et al. (1994) "Conjugated Polymer Light Emitting Diodes on Silicon Substrates," *Appl. Phys. Lett.* 65(21):2636-38.

Smela et al. (1998) "Planar microfabricated polymer light-emitting diodes," *Semicond. Sci. Technol.* 13:433-39.

Franssila, "Introduction to Microfabrication" (John Wiley & Sons, 2004).

Ghandhi, "VLSI Fabrication Principles" (John Wiley & Sons, $2^{nd}$ ed. 1994).

Chang, et al. (1998) "Dual-Color Polymer Light-Emitting Pixels Processed by Hybrid Ink-Jet Printing" Applied Physics Letters 73(18):2561-2563 (abstract only printed from Chemical Abstracts 130:45177).

Guo, Tzung-Fang, et al. (2006) "Organic Oxide/A1 Composite Cathode in Efficient Polymer Light-Emitting Diodes" Applied Physics Letters, AIP, American Institute of Physics, Melville, NY, 88(11):113501.

Niu, Yu-Hua, et al. (2005) "High-Efficiency Light-Emitting Diodes Using Neutral Surfactants and Aluminum Cathode" Applied Physics Letters, AIP, American Institute of Physics, Melville, NY, 86(8):83504.

Rost, et al. (1997) "Novel Light Emitting and Photoconducting Polyarylenevinylene Derivatives Containing Phenylene Arylamine and Phenylene Oxide Units in the Main Chain" Synthetic Metals 84(1-3):269-270.

* cited by examiner

FIGURE 1 – PRIOR ART

Comparison of regular evaporation process (left) and angular ($0° < \alpha < 90°$) evaporation process (right)

CAVITY ELECTROLUMINESCENT DEVICES AND METHODS FOR PRODUCING THE SAME

CROSS-REFERENCE TO RELATED APPLICATIONS

This application claims priority under 35 U.S.C. §119(e)(1) to provisional U.S. Patent Application Ser. Nos. 60/859,072, filed Nov. 14, 2006, and 60/955,834, filed Aug. 14, 2007. The disclosures of the aforementioned applications are herein incorporated by reference in their entireties.

BACKGROUND OF THE INVENTION

Electroluminescent devices for use in electroluminescent displays, such as flat panel displays, are well known in the industry and are set forth in U.S. Pat. No. 5,247,190 to Friend et al.; U.S. Pat. No. 5,682,043 to Pei et al.; U.S. Pat. No. 5,723,873 to Yang; as well as Baigent et al. (1994), "Conjugated Polymer Light-Emitting Diodes on Silicon Substrates," Appl. Phys. Letter, 65(21):2636-38. Such devices may be fabricated upon a suitable substrate in a multilayer thin-film configuration wherein a layer of electroluminescent material is positioned between an electron-injection and a hole-injection electrode layer in a "sandwich" configuration. When a voltage gradient is applied across the electrode layers, holes and electrons are injected into the electroluminescent material from the hole-injection and electron-injection electrode layers, respectively, which results in the emission of light through one of the electrode layers when the holes and electrons are combined in the electroluminescent material.

Commonly, electroluminescent devices for use in electroluminescent displays, such as those disclosed above, include an electrode that is transparent so as to allow light to be emitted there through. See, for example, U.S. Pat. No. 5,869,350 to Heeger et al. However, as very few transparent materials exhibit sufficient electrical conductivity to serve as such electrodes, the selection of materials that may be used is greatly limited. One such semi-optically transparent electrode material is indium tin oxide (ITO).

However, ITO suffers from several drawbacks with respect to its use as an electrode in an electroluminescent device. For instance, ITO is only a semitransparent material and therefore may act as a source of internal reflection when used as an electrode material in electroluminescent devices. Further, the conductivity of ITO is low compared to that of most metals. These characteristics result in a loss of transmission efficiency when ITO is used as an electrode layer. Additionally, ITO lacks chemical stability and thus its use as an electrode material results in a complicated fabrication process. Accordingly, ITO is not an optimal material for use in display applications.

Configurations other than the above described layered or "sandwich" structure have been proposed for use in electroluminescent devices. For example, U.S. Pat. No. 5,677,546 to Yu discloses a surface cell configuration that includes an anode, a cathode and an electroluminescent film, wherein the anode and the cathode are in electrical contact with the same side of the electroluminescent film. Further, Smela et al., (1998), "Planar microfabricated Polymer Light-Emitting Diodes," Semicond. Sci. Technol., 13:433-39, discloses a diode having interdigitated electrodes that are capable of electroluminescence even though they are separated by a small distance. Further still, U.S. Pat. No. 6,593,687 to Pei et al. describes a cavity light emitting electroluminescent device (CLED) that includes a layer of dielectric material that is positioned between an electron-injection and a hole-injection electrode layer, and employs a cavity that is filled with a electroluminescent material. However, the configuration of one or more of these devices suffer from low brightness, as the actual light emission zone is only a small fraction of the device area, or require complicated fabrication methods that prohibit the use of low work function materials as electrode layers, e.g., as cathode layers.

Accordingly, there is a need in the art for an electroluminescent device that has a configuration which overcomes the inherent limitations of prior device configurations, utilizes a simplified fabrication process, and provides for a high-efficiency and bright display when employed in an electroluminescent display device. The present invention meets those and other such needs.

SUMMARY OF THE INVENTION

Aspects of the invention include electroluminescent devices and methods for making the same. In certain embodiments, the devices include a substrate, a hole-injection electrode layer, a dielectric layer, an electroluminescent layer, an electron-injection electrode layer, and a cavity. In certain embodiments, the hole-injection electrode layer is positioned above the substrate, the dielectric layer is positioned above the hole-injection layer, and the electron-injection electrode layer is positioned above the dielectric layer. In certain embodiments, this order is reversed.

In certain embodiments, the cavity extends through at least the dielectric layer and/or may extend through one or more of the electrode layers (e.g., the hole-injection and/or electron-injection electrode layer). In certain embodiments, the electroluminescent layer is positioned in the cavity and is in contact with the hole-injection electrode layer, the dielectric layer, and the electron-injection electrode layer. In certain embodiments, the electroluminescent layer is interposed between the hole-injection electrode layer and the electron-injection electrode layer. In certain embodiments, the electroluminescent layer includes a polymeric material, and in certain embodiments, the electroluminescent layer includes one or more small molecules.

In certain embodiments, an electrode layer (e.g., the electron-injection or hole-injection electrode layer) is positioned above the cavity and is configured for directing light through the substrate. In certain embodiments, an electrode layer (e.g., the electron-injection or hole-injection electrode layer) is positioned above and spans across the cavity. The use of the produced device(s) in electroluminescent displays is also provided herein.

BRIEF DESCRIPTION OF THE DRAWINGS

According to common practice, the various features of the drawings may not be drawn to-scale. Rather, the dimensions of the various features may be arbitrarily expanded or reduced for clarity. Included in the drawings are the following figures:

FIGS. 7A, 7B and 7C illustrate the formation of a layered structure on a substrate wherein the layered structure comprises a hole-injection electrode layer, a dielectric layer, and electron-injection electrode layer. FIGS. 7D and 7E illustrate the formation of a cavity through the layered structure by using a lithographic and etching technique. FIGS. 7F and 7G illustrate the application of an electroluminescent coating material to the interior surface of the cavity so as to achieve conformal contact between the coating material and the interior surface.

FIGS. 8A and 8B illustrate the formation of a sacrificial member in the shape of a desired cavity for the layered structure. FIGS. 8C and 8D illustrate the formation of a layered structure on a substrate around the sacrificial member, wherein the layered structure comprises a substrate, a hole-injection electrode layer and a dielectric layer. FIG. 8E illustrates the removal of the sacrificial member to expose the interior surface of the cavity of the layered structure.

Figure 1:
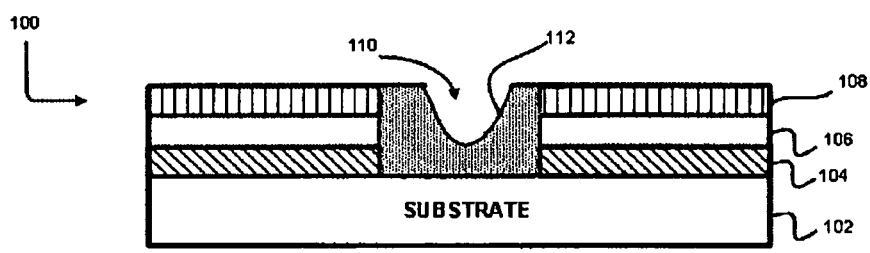
FIG. 1 (prior art) schematically depicts an exemplary electroluminescent device in which the electron-injection electrode layer has been deposited upon a substrate and the remainder of the device has been deposited atop the electron-injection electrode layer.

Before the present invention is further described, it is to be understood that this invention is not limited to particular embodiments described, as such may of course vary. It is also to be understood that the terminology used herein is for the purpose of describing particular embodiments only, and is not intended to be limiting. Unless defined otherwise, all technical and scientific terms used herein have the same meaning as commonly understood by one skilled in the art to which this invention belongs.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention.

Throughout this application, various publications, patents and published patent applications are cited. The disclosures of these publications, patents and published patent applications referenced in this application are hereby incorporated by reference in their entirety into the present disclosure. Citation herein by the Applicant of a publication, patent, or published patent application is not an admission by the Applicant of said publication, patent, or published patent application as prior art.

It must be noted that as used herein and in the appended claims, the singular forms "a", "and", and "the" include plural referents unless the context clearly dictates otherwise. Thus, for example, reference to "an electrode layer" encompasses more than one electrode layer, "a polymer" includes mixtures of different polymers, and the like. It is further noted that the claims may be drafted to exclude any optional element. As such, this statement is intended to serve as antecedent basis for use of such exclusive terminology as "solely", "only" and the like, in connection with the recitation of claim elements, or the use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The term "array" used herein refers to a regular, orderly, and two-dimensional pattern of features such as cavities. Arrays typically but do not necessarily comprise at least about 100 and preferably at least about 1000 cavities.

The term "dielectric strength" is used herein to refer the ability of an electrically insulating material to withstand exposure to an electric field without electrical breakdown, i.e., loss of mechanical integrity. Dielectric strength is sometimes described as having two components, electronic and thermal. Electronic breakdown is caused by the excessive liberation of electrons and usually dominates the electrical breakdown process at a low temperature. Thermal breakdown, on the other hand, is caused by the localized heating due to material heterogeneities and dominates the electrical breakdown process at a higher temperature. Typically, dielectric strength is calculated in terms of volts per centimeter.

The term "electroluminescent" is used herein to describe a material or a device that emits electromagnetic radiation, preferably in the visible range, upon application of an electrical potential and/or current. When electrons and holes are injected into an electroluminescent material, light is emitted upon the combination of the electrons and holes, thereby resulting in electroluminescence.

The term "etchant" is used in its ordinary sense and refers to matter that is capable of chemically removing material from a solid body. An "isotropic etchant" is an etchant that removes material from a solid surface in a direction-invariant manner, whereas an "anisotropic etchant" preferentially removes material from a solid surface in a particular direction, e.g., according to crystallographic orientation of the solid body or the direction of the light energy particles for light assisted etching.

The term "electrical contact" is used herein to refer to a connection between two bodies that permits a flow of current, i.e., transfer of electrons or holes from one body to the other, which usually but does not necessarily imply direct mechanical contact between the two bodies.

The term "emission modifier" refers to a compound that alters the emission spectrum of an electroluminescent material. The emission modifier may be itself an electroluminescent or luminescent material.

"Optional" or "optionally" means that the subsequently described event or circumstance may or may not occur, and that the description includes instances where said event or circumstance occurs and instances where it does not. For example, an electroluminescent device comprising an "optional substrate" means that the substrate may or may not be present and that the description includes either state.

The term "substrate" is used herein in its ordinary sense and means a body or base layer onto which other layers are deposited. For instance, the term "substrate" refers to any type of base layer considered suitable for the manufacture of an electroluminescent device or larger system comprising electroluminescent devices. Specifically, a substrate is used to provide the layered structure of the invention sufficient mechanical strength for handling. Hence, the term may also refer to the substrate with the materials deposited on it during or after any of the various stages of treatment through which it goes during the process of electroluminescent device manufacture, for example during or after the deposition of a hole-injection layer, or the like.

In describing a substrate comprising multiple layers, reference is sometimes made to an "upper" layer, a "top" layer, or a "lower" layer. In general, an "upper" layer refers to one which is deposited after the layers described as lower. There is no intention to suggest by this terminology that the deposition must necessarily be done with the "upper" layer lying above the "lower" layer in the ordinary sense of being farther from the center of the earth. Similarly, when one speaks of depositing "atop" or "above" a substrate or a layer of a substrate, one means only that the deposited material is added to the side of the substrate to which material has previously been added. There is no implication that the deposition takes place with the material flowing downward in the ordinary sense of flowing towards the center of the earth. There is likewise no implication that no other material exists between layers A and B if layer A is described as being "above" layer B.

The term "transparent" here is to be construed as allowing an amount of light transmission which is appropriate in the circumstances. A transparent material need not be as transmissive as plate glass provided it is sufficiently transmissive for the application at hand. A transparent material may also allow only particular frequency ranges to pass through and block others, if the blocking is desired or is not a problem in the particular application. "Light" here should be understood to encompass infrared and ultraviolet radiation as well as visible light.

In describing molecular structures, e.g., of arylamine-substituted poly(arylene vinylenes) useful in conjunction with the invention, the following definitions apply:

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, 2-ethylhexyl, decyl, and the like, as well as cycloalkyl groups such as cyclopentyl, cyclohexyl and the like. Generally, although again not necessarily, alkyl groups herein contain 1 to about 12 carbon atoms. The term "lower alkyl" intends an alkyl group of one to six carbon atoms, preferably one to four carbon atoms. "Substituted alkyl" refers to alkyl substituted with one or more substituent groups, and the terms "heteroatom-containing alkyl" and "heteroalkyl" refer to alkyl in which at least one carbon atom is replaced with a heteroatom.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing one to six, more preferably one to four, carbon atoms.

The term "aryl" as used herein, and unless otherwise specified, refers to a univalent aromatic substituent containing a single aromatic ring or multiple aromatic rings that are fused together or linked covalently. Preferred aryl groups contain one aromatic ring or two fused or linked aromatic rings, e.g., phenyl, naphthyl, biphenyl, fluorenyl, and the like. "Substituted aryl" refers to an aryl moiety substituted with one or more substituent groups, and the terms "heteroatom-containing aryl" and "heteroaryl" refer to aryl in which at least one carbon atom is replaced with a heteroatom.

The term "arylene" as used herein, and unless otherwise specified, refers to a divalent aromatic substituent containing a single aromatic ring or multiple aromatic rings that are fused together or linked covalently. Preferred arylene groups contain one aromatic ring or two fused or linked aromatic rings. "Substituted arylene" refers to an arylene moiety substituted with one or more substituent groups, and the terms "heteroatom-containing arylene" and "heteroarylene" refer to arylene in which at least one carbon atom is replaced with a heteroatom.

The term "aralkyl" refers to an alkyl group with an aryl substituent, and the term "aralkylene" refers to an alkylene group with an aryl substituent; the term-"alkaryl" refers to an aryl group that has an alkyl substituent, and the term "alkarylene" refers to an arylene group with an alkyl substituent.

The terms "halo" and "halogen" are used in the conventional sense to refer to a chloro, bromo, fluoro or iodo substituent. The terms "haloalkyl," "haloalkenyl" or "haloalkynyl" (or "halogenated alkyl," "halogenated alkenyl," "halogenated aromatic" or "halogenated alkynyl") refers to an alkyl, alkenyl, aromatic or alkynyl group, respectively, in which at least one of the hydrogen atoms in the group has been replaced with a halogen atom.

The term "heteroatom-containing" refers to a molecule or molecular fragment in which one or more carbon atoms is replaced with an atom other than carbon, e.g., nitrogen, oxygen, sulfur, phosphorus or silicon. Similarly, the term "heteroalkyl" refers to an alkyl substituent that is heteroatom-containing, the term "heterocyclic" refers to a cyclic substituent that is heteroatom-containing, the term "heteroaryl" refers to an aryl substituent that is heteroatom-containing, and the like.

"Hydrocarbyl" refers to univalent hydrocarbyl radicals containing 1 to about 30 carbon atoms, preferably 1 to about 24 carbon atoms, most preferably 1 to about 12 carbon atoms, including branched or unbranched, saturated or unsaturated species, such as alkyl groups, alkenyl groups, aryl groups, and the like. The term "lower hydrocarbyl" intends a hydrocarbyl group of one to six carbon atoms, preferably one to four carbon atoms. The term "hydrocarbylene" intends a divalent hydrocarbyl moiety containing 1 to about 30 carbon atoms, preferably 1 to about 24 carbon atoms, most preferably 1 to about 12 carbon atoms, including branched or unbranched, saturated or unsaturated species, or the like. The term "lower hydrocarbylene" intends a hydrocarbylene group of one to six carbon atoms, preferably one to four carbon atoms. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom. Similarly, "substituted hydrocarbylene" refers to hydrocarbylene substituted with one or more substituent groups, and the terms "heteroatom-containing hydrocarbylene" and "heterohydrocarbylene" refer to hydrocarbylene in which at least one carbon atom is replaced with a heteroatom.

A "Lewis acid" refers to any species with a vacant orbital, in contrast to a "Lewis base," which refers to a compound with an available pair of electrons, either unshared or in a .pi.-orbital. Typically, a Lewis acid refers to a compound containing an element that is two electrons short of having a complete valence shell.

By "substituted" as in "substituted hydrocarbyl," "substituted hydrocarbylene," "substituted alkyl," "substituted alkenyl" and the like, as alluded to in some of the aforementioned definitions, is meant that in the hydrocarbyl, hydrocarbylene, alkyl, alkenyl or other moiety, at least one hydrogen atom bound to a carbon atom is replaced with one or more substituents that are functional groups such as hydroxyl, alkoxy, thio, amino, halo, silyl, and the like. When the term "substituted" appears prior to a list of possible substituted groups, it is intended that the term apply to every member of that group. That is, the phrase "substituted alkyl, alkenyl and alkynyl" is to be interpreted as "substituted alkyl, substituted alkenyl and substituted alkynyl." Similarly, "optionally substituted alkyl, alkenyl and alkynyl" is to be interpreted as "optionally substituted alkyl, optionally substituted alkenyl and optionally substituted alkynyl."

Other definitions of basic organic chemical terms may be found in U.S. Pat. Nos. 6,593,687 and 7,098,297, which are incorporated herein by reference for the purpose of adopting those definitions.

Relevant information regarding the fabrication processes known to those of skill in the art can be found, for example, in Sami Franssila, Introduction to Microfabrication (John Wiley & Sons, 2004). Reference may also be made to Sorab K. Ghandhi, VLSI Fabrication Principles (John Wiley & Sons, 2d ed. 1994).

DETAILED DESCRIPTION

Aspects of the subject invention include electroluminescent devices and methods for making the same. In certain embodiments, the devices include a substrate, a hole-injection electrode layer, a dielectric layer, an electroluminescent layer, an electron-injection electrode layer, and a cavity. In certain embodiments, the hole-injection electrode layer is positioned above the substrate, the dielectric layer is positioned above the hole-injection layer, and the electron-injection electrode layer is positioned above the dielectric layer. In certain embodiments, this order is reversed.

In certain embodiments, the cavity extends through at least the dielectric layer and/or may extend through one or more of the electrode layers (e.g., the hole-injection and/or electron-injection electrode layer). In certain embodiments, the electroluminescent layer is positioned in the cavity and is in contact with the hole-injection electrode layer, the dielectric layer, and the electron-injection electrode layer. In certain embodiments, the electroluminescent layer is interposed between the hole-injection electrode layer and the electron-injection electrode layer.

In certain embodiments, the electroluminescent layer includes a polymeric material, and in certain embodiments, the electroluminescent layer includes one or more small molecules. In certain embodiments, an electrode layer (e.g., the electron-injection or hole-injection electrode layer) is positioned above the cavity and is configured for directing light through the substrate. In certain embodiments, an electrode layer (e.g., the electron-injection or hole-injection electrode layer) is positioned above and spans across the cavity. The use of the produced device(s) in electroluminescent displays is also provided herein.

The subject electroluminescent devices will be described first, followed by a description of the methods for fabricating such devices, as well as their representative use in the production of electroluminescent (e.g., flat panel) displays.

Electroluminescent Devices

As summarized above, an aspect of the subject invention is an electroluminescent device. In certain embodiments, the electroluminescent device includes a substrate. The term "substrate" is used herein in its ordinary sense and means a body or base layer onto which other layers may be deposited. Any suitable substrate may be used so long as it is of sufficient mechanical strength to be used as a base upon which the layered structure of the invention can be provided.

Accordingly, the substrate may be comprised of any of a number of materials well known in the art depending on the desired use for which the electroluminescent device is to be employed. For example, in certain embodiments, radiation generated by the combining of holes and electrons in the electroluminescent material results in the generation of electromagnetic radiation (e.g., light) that is to be emitted and transmitted through the substrate. Hence, in certain embodiments, the substrate may be transparent or semi-transparent to the emitted radiation.

Various silicon, ceramic and polymeric materials have sufficient optical transparency for transmitting visible emitted radiation. Hence, a suitable substrate for use with the subject invention may be a transparent or semi-transparent base material that includes silicon, a ceramic, plastic(s) and/or a polymeric material.

Suitable substrate materials may be crystalline or amorphous. Suitable silicon derived materials include, but are not limited to silicon dioxide, various silicon-based glasses, such as soda-lime glass and borosilicate glass. Suitable transparent or semi-transparent ceramics include, but are not limited to, aluminum oxide, zirconium oxide, sodium chloride, diamond, and/or the like. Examples of transparent or semi-transparent polymeric materials for transmitting emitted radiation include, but are not limited to, polyethylenenaphthalate, polycarbonate, polyethylene, polypropylene, polyester, polyimide, polyamides, polyacrylates and polymethacryates.

The substrate may be rigid or flexible and may be of any suitable shape and configuration. Accordingly, in certain embodiments, a flexible polymeric substrate is provided. Optionally, an insulating layer may be included between the substrate and/or one or more of the other layers of the subject device. Further, the substrate may be detachable from the layered structure of the device. Additionally, in certain embodiments, the substrate may include a semiconductor material, such as silicon, and may additionally contain microcircuitry, in which case, the electroluminescent device may comprise an integrated portion of a microcircuitry-driven device.

In certain embodiments, the electroluminescent device includes an electrode layer positioned above the substrate. In certain embodiments, the electrode layer is positioned directly or indirectly above the substrate. By "directly above" is meant that the electrode layer is directly above and actually in contact with the substrate. By "indirectly above" is meant that the electrode layer is not directly above nor actually in contact with the substrate, rather an intervening layer or coating (e.g., an insulating layer) separates the hole-injection electrode layer from the substrate. For instance, the electrode layer may be positioned directly above the substrate, such that the electrode layer comes into direct contact with the substrate, or an intermediary layer (e.g., a barrier layer) may be interposed between the substrate and the electrode layer. Specifically, where the substrate is plastic, one or more barrier layers may be positioned between the substrate and the electrode layer. Such an intermediary layer may or may not continue along the entire length of the substrate and/or electrode layer.

In certain embodiments, the electrode layer positioned above the substrate is an anode layer. In certain embodiments, the anode layer includes a hole-injection electrode layer. The hole-injection electrode layer may be the anode layer or may be a separate layer that may or may not be directly associated (e.g., in contact with) the anode layer. Accordingly, in certain embodiments, the anode layer is in direct contact with the substrate and in direct contact with a hole injection layer. In certain embodiments, the anode layer is in contact with the substrate, a dielectric layer is positioned above the anode layer, and a hole injection layer is positioned above the dielectric layer. In certain embodiments, a hole transport layer is also included, for instance, a hole transport layer may be a layer that is positioned to be in contact with a hole-injection layer, which hole-injection layer may be positioned to be in contact with an anode layer or a dielectric layer.

In certain embodiments, the electrode layer that is positioned above the substrate is a cathode layer. In certain embodiments, the cathode layer includes an electron-injection layer. The electron-injection layer may be the cathode layer or may be a separate layer that may or may not be associated (e.g., in contact with) the cathode layer. Accordingly, in certain embodiments, the cathode layer is in direct contact with the substrate and in direct contact with a electron injection layer. In certain embodiments, the cathode layer is in contact with the substrate, a dielectric layer is positioned above the cathode layer, and an electron injection layer is positioned above the dielectric layer. In certain embodiments, an electron transport layer is also included, for instance, an electron transport layer may be a layer that is positioned to be in contact with a electron-injection layer, which electron-injection layer may be positioned to be in contact with a cathode layer or a dielectric layer.

Accordingly, whenever a hole-injection electrode layer is referenced, the referent may include a hole-injection layer and an anode layer (which may or may not be the same element), and further whenever an electron-injection electrode layer is referenced, the referent may include both an electron-injection layer and a cathode layer (which may or may not be the same element).

In certain embodiments, a hole-injection electrode layer (e.g., which may include or be the same as an anode layer) is positioned above the substrate. The hole-injection electrode layer may be composed of any suitable material capable of injecting holes into an associated material, for instance, an electroluminescent material. For example, various metallic, polymeric, ceramic and semiconducting materials may be capable of injecting holes into an associated electroluminescent material that is in contact with the hole-injection electrode layer. In certain embodiments, the hole-injection electrode layer includes a metallic material, for instance, a material with a high electrical conductivity. In certain embodiments, the hole-injection electrode layer includes a high work function material. Accordingly, in certain embodiments, the hole-injection electrode layer includes a metal such as gold or copper or other such metallic material with a high conductivity and chemical inertness with respect to the other components of the electroluminescent device. Other metals and/or other materials suitable for use as a hole-injection electrode material include, but are not limited to, nickel, palladium, platinum, chromium, molybdenum, tungsten, manganese, nickel, cobalt, metal oxides and combinations and alloys thereof, as well as fullerenes, carbon nano-tubes. For instance, where the bottom electrode layer may be an anode layer, the anode may include indium tin oxide (ITO).

In certain embodiments, the hole-injection electrode layer may include a conductive polymeric material, a small molecular organic, and/or inorganic layer. For instance, the hole-injection electrode layer may include an anode layer as well as a hole transport layer. Accordingly, the hole-injection electrode layer may include a polymeric material such as, but not limited to: polyaniline, polypyrrole and poly(3,4-ethylenedioxy-2,5-thiophene), triphenylamine, tetra-N-phenyl-benzidine, N,N'-Di-[(1-naphthyl)-N,N'-diphenyl]-1,1'-biphenyl)-4,4'-diamine, and their derivatives and analogs. In addition, certain ceramic materials such as conductive chalcogenides, e.g., metal oxides, mixed metal oxides and metal sulfides as well as mixed metal sulfides may also be suitable.

In certain embodiments, the electrode layer is constructed as a laminate, composite or mixture of materials. Additionally, the electrode layer may have a thickness of about 200 to about 10,000 angstroms, for instance, about 400 to about 5000 angstroms, such as about 1000 to about 2000 angstroms.

Accordingly, in certain embodiments, the hole-injection electrode layer may be the electrode layer itself, and in other embodiments, the hole-injection layer may be a electrode layer (electrical conduction layer) plus a layer of organic (either small molecule or conductive polymer).

In certain embodiments, the electroluminescent device includes a dielectric layer positioned above the hole-injection electrode layer. In certain embodiments, the dielectric layer is positioned directly or indirectly above the hole-injection electrode layer. By "directly above" is meant that the dielectric layer is directly above and actually in contact with the hole-injection electrode layer. By "indirectly above" is meant that the dielectric layer is not directly above nor actually in contact with the hole-injection electrode layer, rather an intervening layer or coating separates the dielectric layer from the hole-injection electrode layer.

The dielectric layer may be composed of any suitable material capable of serving as a barrier between the electrodes to provide an electrical barrier and to prevent electrical shorting between the electrode layers. Accordingly, in certain embodiments, the dielectric layer is substantially pinhole free and composed from a high-resistivity material having an electrical resistivity no less than about $10^8$ ohm-cm, preferably no less than about $10^{12}$ ohm-cm. Suitable high-resistivity materials include, but are not limited to, silicon nitride, boron nitride, aluminum nitride, silicon oxide, titanium oxide, aluminum oxide, polyimide, polyvinylidene fluoride, paralene, as well as various sol-gel materials and pre-ceramic polymers.

In certain embodiments, the dielectric layer is configured for increasing electroluminescent efficiency and decreasing power consumption. Accordingly, in certain embodiments, the dielectric layer is thin. For instance, in certain embodiments, the term "thin" means that the dielectric layer is capable of reducing the distance between the electrodes and therefore reducing the voltage needed to generate electroluminescence. Specifically, in certain embodiments, the dielectric layer does not exceed about 1 micrometer in thickness. For instance, in certain embodiments, the dielectric layer may have a thickness of about 100 to about 5000 angstroms, for instance, about 500 to about 2000 angstroms. In certain embodiments, the dielectric layer exceeds 100 nms, exceeds 120, exceeds 150, or exceeds 200 nm in thickness.

However, it is to be noted that in certain situations dielectric materials may break down if excessive voltage is applied. Hence, a suitable dielectric material for use in an electroluminescent device of the subject invention has sufficient dielectric strength for its thickness to withstand the operating voltage required for an electroluminescent material to emit photons when an operating voltage is applied between a hole-injection and an electron-injection electrode layers that are separated from one another by the dielectric layer and in contact with an electroluminescent material. Accordingly, the dielectric material layer may have a sufficient dielectric strength for its thickness to withstand at least about 2 volts over the operating voltage. For example, if the device is constructed to emit light when a 5-volt potential is applied, the dielectric layer should be able to withstand at least about 7 volts.

In certain embodiments, the electroluminescent device includes an electron-injection electrode layer that is positioned above the substrate. In certain embodiments, the electron-injection electrode layer is positioned above the substrate and above the hole-injection electrode layer, and may also be positioned above a dielectric layer (if included), which layer, as described below, may at least partially bound a cavity.

In certain embodiments, the electron-injection electrode layer is positioned directly or indirectly above a dielectric layer. By "directly above" is meant that the electron-injection electrode layer is directly above and actually in contact with a dielectric layer. By "indirectly above" is meant that the electron-injection electrode layer is not directly above nor actually in contact with a dielectric layer, rather an intervening layer or coating separates the electron-injection electrode layer from the dielectric layer, for instance, a barrier layer may be included. In certain embodiments, the electron-injection electrode layer is positioned above the substrate and the hole-injection electrode layer is positioned directly or indirectly above the a dielectric layer.

The electron-injection electrode layer may be composed of any suitable material capable of injecting electrons into an associated electroluminescent material. For example, various metallic, polymeric, ceramic and semiconducting materials may be capable of injecting electrons into the electroluminescent material, such as metals like lithium, barium, beryllium, magnesium, calcium, sodium, potassium, cesium, strontium, boron, aluminum, gallium, indium, silver and alloys thereof. In certain embodiments, the electron-injection electrode layer includes an alloy containing a low work function material (e.g., Li—Al or Mg—Al) and/or may include a bilayer structure, i.e. an electron-injection layer may include a low work function metal or a compound containing such low work function metal elements (e.g., lithium fluorite, lithium oxide, barium oxide, barium acetylacetonate), which may be capped by a conduction layer (e.g., Ca/Al, Ba/Al, or Mg/Ag). In certain embodiments, the electron-injection layer includes a cathode layer as well as an electron-injection and/or transport layer.

Accordingly, the electron-injection layer can be the cathode metal itself (for instance, in the case of using and Li—Al or Mg—Ag alloy cathode) or an electrode layer (such as Al or Ag) plus a electron-injection layer (such as a thin layer of Ca, Li, Mg, LiF, or even an organic compound). In certain embodiments, the term "cathode" refers to the electrode metal plus the electron-injection layer; and in certain embodiments, the term "cathode" refers only to the electron-injection layer. For example, a "Ca/Al cathode" may generally be referred to as a "Ca cathode".

In certain embodiments, the electron-injection electrode layer is constructed as a laminate, composite or mixture of materials. Additionally, the electron-injection electrode layer may have a thickness of about 200 to about 10,000 angstroms, for instance, about 400 to about 5000 angstroms, such as about 1000 to about 2000 angstroms. In certain embodiments, the electron-injection electrode layer is a composite of two layers, such as a thin layer of about 10 to about 200 angstroms of a low work function metal that may be in contact with an electroluminescent material and/or a dielectric layer, and a thicker top layer of a metal such as silver or aluminum. In certain embodiments, the electron-injection electrode layer is configured for directing light through the substrate.

In certain embodiments, the electroluminescent device includes a cavity, which cavity at least extends through a dielectric layer (if present) and may additionally extend through an electrode layer, for instance, a hole or electron-injection layer. For instance, in certain embodiments, the cavity extends through both the dielectric layer and the bottom most electrode layer (e.g., with respect to the substrate). In certain embodiments, the cavity extends through the dielectric layer but does not extend through the electrode layer(s). In such embodiments, the bottom most electrode layer (e.g., the hole-injection or electron-injection layer) comprises a material that is at least semi-transparent to electrochemical radiation (e.g., light).

In certain embodiments, the cavity is at least partially bounded by one or more of a substrate, a hole-injection electrode layer, a dielectric layer, and an electron-injection electrode layer. For instance, in certain embodiments, the cavity is bounded by the hole-injection and the electron-injection electrode layers and may further be at least partially bounded by a portion of the dielectric material layer (if included) and/or the substrate or a material coating the substrate. Specifically, in certain embodiments, the cavity is bounded by a portion of the substrate, the hole-injection electrode layer, the dielectric layer, and the electron-injection electrode layer. In certain embodiments, the cavity is bounded by a portion of the hole-injection electrode layer, the dielectric layer, and the electron-injection electrode layer. In certain embodiments, the cavity is bounded by a portion of the substrate, the hole-injection electrode layer, and the electron-injection electrode layer.

In certain embodiments, the cavity includes an electroluminescent layer that is positioned within the lumen of the cavity. In certain embodiments, the cavity may be filled with a material, such as an electroluminescent material. In certain embodiments, the fill material, e.g., electroluminescent material, entirely fills the dimensions of the cavity, but does not over-flow beyond the dimensions of the cavity, nor is the material present between the cavity and the electron-injection electrode layer, in such a manner that it would be considered an intervening layer between the cavity and the electron-injection electrode layer. In certain embodiments, the fill material, e.g., electroluminescent material, entirely fills the dimensions of the cavity and over-flows beyond the dimensions of the cavity so as to form a material layer that is present between the cavity and the electron-injection electrode layer, in such a manner that it would be considered an intervening layer between the cavity and the electron-injection electrode layer.

In certain embodiments, the cavity does not extend through the electron-injection electrode layer. Rather, in certain embodiments, the electron-injection electrode layer may at least partially bound the cavity on one or more sides. For instance, in certain embodiments, the electron-injection electrode layer is positioned above the cavity and its length spans across the cavity (e.g., laterally). In certain embodiments, the electron-injection electrode layer bounds the cavity, however, the electroluminescent material which fills the cavity over-flows beyond the dimensions of the cavity and forms a material layer that is present between the cavity and the electron-injection electrode layer. In certain embodiments, the electron-injection electrode layer bounds the cavity and the electroluminescent material which fills the cavity does not over-flow beyond the dimensions of the cavity nor does it form a material layer between the cavity and the electron-injection electrode layer.

Accordingly, as can be seen with reference to the above, the cavity is bounded by various portions of the components of the electroluminescent device. Hence, the various surfaces of the portions of the components of the electroluminescent device which bound the cavity are herein referenced as being "internal surfaces of the cavity." Accordingly, the electroluminescent layer positioned within the cavity may contact one or more of a substrate, a material coating the substrate, a hole-injection electrode layer, a dielectric layer, and a electron-injection electrode layer. For instance, in certain embodiments, an electroluminescent layer positioned within the cavity contacts a surface of the substrate, a hole-injection electrode layer, a dielectric layer, and a electron-injection electrode layer. In certain embodiments, an electroluminescent layer positioned within the cavity contacts a hole-injection electrode layer, a dielectric layer, and an electron-injection electrode layer. For instance, in certain embodiments, the electroluminescent layer positioned within the cavity, does not contact the substrate. In certain embodiments, an electroluminescent layer positioned within the cavity contacts a hole-injection electrode layer and a electron-injection electrode layer. For instance, in certain embodiments, the electroluminescent layer positioned within the cavity, does not contact a dielectric layer.

A cavity of the subject invention may have any suitable configuration so long as it allows for both holes and electrons to be injected into an electroluminescent layer contained within the cavity. For example, in certain embodiments, the cavity is axially symmetrical. In certain embodiments, the cavity includes a constant cross-sectional area along the cavity axis. In certain embodiments, the cavity has a smaller cross-sectional area at the dielectric layer than the hole-injection electrode layer.

As can be seen with reference to FIG. 1, an electroluminescent device as known in the art is set forth. The device (100) includes a substrate (102), hole-injection electrode layer (104), a dielectric layer (106), and an electron-injection electrode layer (108). The device also includes a cavity (110) that includes an electroluminescent coating material (112).

Figure 2:
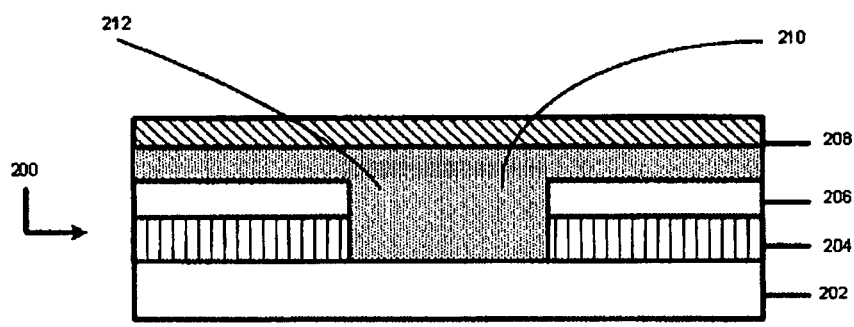
FIG. 2 depicts an electroluminescent device of the present invention in which the electron-injection electrode layer is deposited above the electroluminescent material, the electroluminescent material forms a layer that is interposed between the electron-injection electrode layer and the dielectric layer, and the cavity extends through both the dielectric layer and the hole-injection electrode layer, but does not extend through the electron-injection electrode layer.

As can be seen with respect to FIG. 2, an electroluminescent device in accordance with the subject invention is set forth. The device (200) includes a substrate (202), a hole-injection electrode layer (204), a dielectric layer (206), and an electron-injection electrode layer (208). The device also includes a cavity (210) that includes an electroluminescent coating material (212).

As can be seen with reference to FIG. 2, the electroluminescent coating material (212), forms a material layer that separates the electron-injection electrode layer (208) from the dielectric layer (206). Specifically, in certain embodiments, the electroluminescent coating material (212) not only entirely fills the cavity but overflows and forms a separate material layer that is interposed between the electron-injection electrode layer (208) and the dielectric layer (206).

Additionally, as can be seen with respect to FIG. 2, the cavity (210) extends through both the dielectric layer (206) and hole-injection electrode layer (204) and is therefore bounded by the dielectric layer (206), the hole-injection electrode layer (204) and a top surface of the substrate. The electron-injection electrode layer (208) spans across the cavity (212).

It is to be noted that although FIG. 2 has been described with respect to the hole-injection electrode layer being the bottom layer positioned above the substrate and the electron-injection electrode layer being positioned as the top most layer away from the substrate, the order of the electrode layers may be reversed, e.g., the electron-injection electrode layer may be the bottom layer positioned above the substrate and the hole-injection electrode layer may be positioned as the top most layer away from the substrate.

Figure 3:
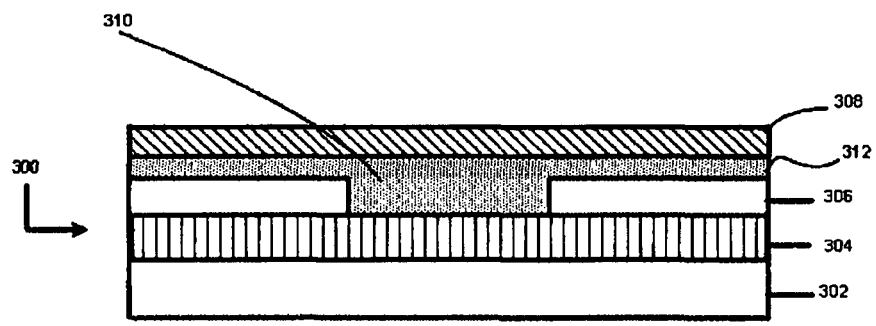
FIG. 3 depicts an electroluminescent device of the present invention in which the electron-injection electrode layer is deposited above the electroluminescent material, the electroluminescent material forms a layer that is interposed between the electron-injection electrode layer and the dielectric layer, and the cavity extends through the dielectric layer but does not extend through the hole-injection electrode layer or the electron-injection electrode layer.

As can be seen with respect to FIG. 3, an electroluminescent device in accordance with the subject invention is set forth. The device (300) includes a substrate (302), a hole-injection electrode layer (304), a dielectric layer (306), and an electron-injection electrode layer (308). The device also includes a cavity (310) that includes an electroluminescent coating material (312).

As can be seen with reference to FIG. 3, the electroluminescent coating material (312), forms a material layer that separates the electron-injection electrode layer (308) from the dielectric layer (306). Specifically, in certain embodiments, the electroluminescent coating material (312) not only entirely fills the cavity but overflows and forms a separate material layer that is interposed between the electron-injection electrode layer (308) and the dielectric layer (306).

Additionally, as can be seen with respect to FIG. 3, although the cavity (310) extends through the dielectric layer (306), the cavity (310) does not extend through the hole-injection electrode layer (304). Accordingly, the cavity is bounded by the dielectric layer (306) and the hole-injection electrode layer (304). The electron-injection electrode layer (308) spans across the cavity (312).

It is to be noted that although FIG. 3 has been described with respect to the hole-injection electrode layer being the bottom layer positioned above the substrate and the electron-injection electrode layer being positioned as the top most layer away from the substrate, the order of the electrode layers may be reversed, e.g., the electron-injection electrode layer may be the bottom layer positioned above the substrate and the hole-injection electrode layer may be positioned as the top most layer away from the substrate.

Figure 4:
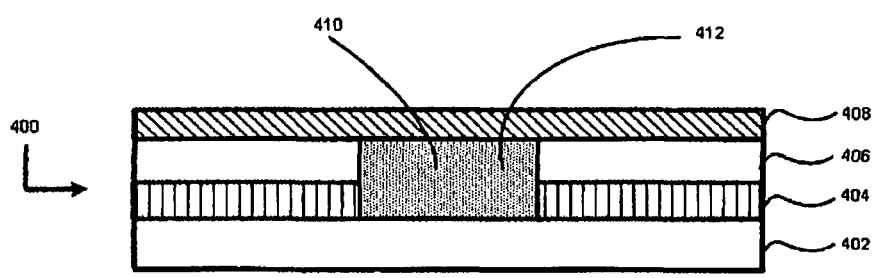
FIG. 4 depicts an electroluminescent device of the present invention in which the electron-injection electrode layer is deposited above the electroluminescent material, the electroluminescent material fills the cavity but is not interposed between the electron-injection electrode layer and the dielectric layer, and the cavity extends through both the dielectric layer and the hole-injection electrode layer, but does not extend through the electron-injection electrode layer.

As can be seen with respect to FIG. 4, an electroluminescent device in accordance with the subject invention is set forth. The device (400) includes a substrate (402), a hole-injection electrode layer (404), a dielectric layer (406), and an electron-injection electrode layer (408). The device also includes a cavity (410) that includes an electroluminescent coating material (412).

As can be seen with reference to FIG. 4, the electroluminescent coating material (412) is contained entirely within the cavity (410). Specifically, in certain embodiments, the cavity (410) extends through both the dielectric layer (406) and hole-injection electrode layer (404) and is therefore bounded by the dielectric layer (406), the hole-injection electrode layer (404), a top surface of the substrate (402), and the electron-injection electrode layer (408), which spans across and bounds the cavity (412).

It is to be noted that although FIG. 4 has been described with respect to the hole-injection electrode layer being the bottom layer positioned above the substrate and the electron-injection electrode layer being positioned as the top most layer away from the substrate, the order of the electrode layers may be reversed, e.g., the electron-injection electrode layer may be the bottom layer positioned above the substrate and the hole-injection electrode layer may be positioned as the top most layer away from the substrate.

Figure 5:
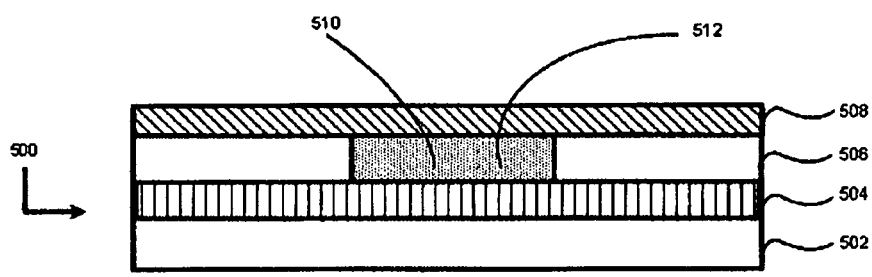
FIG. 5 depicts an electroluminescent device of the present invention in which the electron-injection electrode layer is deposited above the electroluminescent material, the electroluminescent material fills the cavity but is not interposed between the electron-injection electrode layer and the dielectric layer, and the cavity extends through the dielectric layer but does not extend through the hole-injection electrode layer or the electron-injection electrode layer.

As can be seen with respect to FIG. 5, an electroluminescent device in accordance with the subject invention is set forth. The device (500) includes a substrate (502), a hole-injection electrode layer (504), a dielectric layer (506), and an electron-injection electrode layer (508). The device also includes a cavity (510) that includes an electroluminescent coating material (512).

As can be seen with reference to FIG. 5, the electroluminescent coating material (512) is contained entirely within the cavity (510). Specifically, in certain embodiments, the cavity (510) extends through the dielectric layer (406) but not the hole-injection electrode layer (504) and is therefore bounded by the dielectric layer (506), the hole-injection electrode layer (404), and the electron-injection electrode layer (508), which spans across and bounds the cavity (512).

It is to be noted that although FIG. 5 has been described with respect to the hole-injection electrode layer being the bottom layer positioned above the substrate and the electron-injection electrode layer being positioned as the top most layer away from the substrate, the order of the electrode layers may be reversed, e.g., the electron-injection electrode layer may be the bottom layer positioned above the substrate and the hole-injection electrode layer may be positioned as the top most layer away from the substrate.

Figure 6:
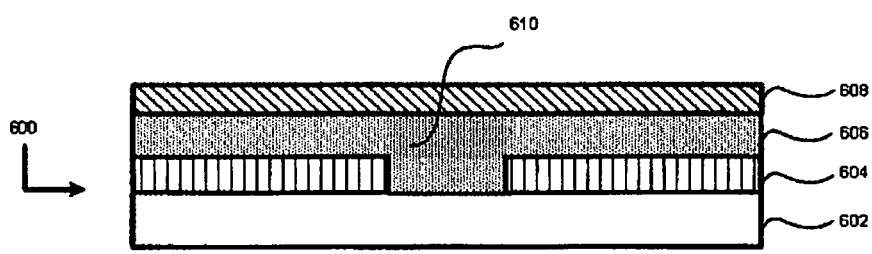
FIG. 6 depicts an electroluminescent device of the present invention in which the electron-injection electrode layer is deposited above the electroluminescent material, the electroluminescent material fills the cavity and is interposed between the electron-injection electrode layer and the hole-injection electrode layer, and the cavity extends through the dielectric layer and the hole-injection electrode layer, but there is no dielectric layer, rather the electroluminescent material serves the purpose of separating the hole-injection electrode layer and the electron-injection electrode layer.

As can be seen with respect to FIG. 6, an electroluminescent device in accordance with the subject invention is set forth. The device (600) includes a substrate (602), a hole-injection electrode layer (604), and an electron-injection electrode layer (608). The device also includes a cavity (610) that includes an electroluminescent coating material (612).

As can be seen with reference to FIG. 6, the electroluminescent coating material (612), forms a material layer that separates the electron-injection electrode layer (608) from the hole-injection electrode layer (604). Specifically, in certain embodiments, the electroluminescent coating material (612) not only entirely fills the cavity but overflows and forms a separate material layer that is interposed between the electron-injection electrode layer (608) and the hole-injection electrode layer (604).

Additionally, as can be seen with respect to FIG. 6, the cavity is bounded by the hole-injection electrode layer (604) and a top surface of the substrate (602). The electron-injection electrode layer (608) spans across the cavity (612).

It is to be noted that although FIG. 6 has been described with respect to the hole-injection electrode layer being the bottom layer positioned above the substrate and the electron-injection electrode layer being positioned as the top most layer away from the substrate, the order of the electrode layers may be reversed, e.g., the electron-injection electrode layer may be the bottom layer positioned above the substrate and the hole-injection electrode layer may be positioned as the top most layer away from the substrate.

Accordingly, in certain embodiments, an electroluminescent material layer separates the top most (e.g., with respect to the substrate) electrode layer from the dielectric layer. See, for instance, FIGS. 2 and 3. In certain embodiments, the top most electrode layer directly contacts the dielectric layer. See, for instance, FIGS. 4 and 5. In certain embodiments, there is no dielectric layer, rather the electroluminescent layer separates the hole-injection electrode layer from the electron-injection electrode layer. See, for instance, FIG. 6.

Further, in certain embodiments, the electron-injection electrode layer bounds the cavity and may additionally directly or indirectly cover at least the entire length of the cavity. Hence, in certain embodiments, the electron-injection electrode layer directly covers the cavity. By "directly covers the cavity," is meant that the electron-injection electrode layer bounds and directly covers one side of the cavity without the presence of an intervening layer. Hence, although the cavity may be filled with a material, such as an electroluminescent material, neither the filling material nor another material over-flows beyond the dimensions of the cavity, or is present between the cavity and the electron-injection electrode layer, in such a manner that it would be considered an intervening layer between the cavity and the electron-injection electrode layer, which layer bounds and directly covers the cavity on one side. See, for instance, FIGS. 4 and 5.

In certain embodiments, the electron-injection electrode layer is positioned above and bounds the cavity but indirectly covers the cavity. By "indirectly covers the cavity," is meant that an intervening layer is present between the electron-injection electrode layer and one side of the cavity, such that although the electron-injection electrode layer is positioned above, bounds and spans across a length of the cavity (e.g., entirely), an intervening layer is present between the electron-injection electrode layer and the cavity. For instance, in certain embodiments, the material filling the cavity, e.g., an electroluminescent material, overflows the dimensions of the cavity in such a manner that it forms an intermediary or intervening layer between the cavity and the electron-injection electrode layer. See, for instance, FIGS. 2 and 3. Further, as set forth above, the position of the electron-injection electrode layer and the hole-injection electrode layer may be reversed.

As set forth above, in certain embodiments, the electroluminescent device includes an electroluminescent material, for instance, an electroluminescent layer. In certain embodiments, the electroluminescent material is positioned at least partially in a cavity of the device. For instance, in certain embodiments, the electroluminescent material substantially or totally fills a cavity of the device. In certain embodiments, the electroluminescent material forms an extended layer, for instance, the electroluminescent material may not only fill the dimensions of the cavity but may also form an additional layer that separates the electrode layer (e.g., electron-injection layer) from a dielectric layer.

The electroluminescent material may be composed of any suitable material capable of receiving a hole from the hole-injection layer and an electron from the electron-injection layer and emitting electromagnetic radiation (e.g., light) when the injected holes and electrons combine. Accordingly, in certain embodiments, the electroluminescent material may include any of a number of organic or inorganic compounds or mixtures thereof, such as multi-layers of organics or small molecules or the like. For instance, the electroluminescent layer may include a polymeric material or be composed of one or more small molecule materials. However, the material must contain at least one electroluminescent compound, for instance, an organic, inorganic or small molecule electroluminescent compound. In certain embodiments, the electroluminescent compound may include a simple organic molecule or complex polymer or copolymer. For example, a simple organic luminescent molecule may include tris(8-hydroxyquinolinato)-aluminum or perylene.

In certain embodiments, the electroluminescent material includes a polymer or copolymer. The molecular structure of a suitable polymer or copolymer may include a carbon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft copolymers, or combinations thereof. Examples of suitable electroluminescent polymers useful in conjunction with the present invention include, but are not limited to, conjugated polymers such as, polyparaphenylenes, polythiophenes, polyphenylenevinylenes, polythienylvinylenes, polyfluorenes, 1,3,4-oxadiazole-containing polymers, and various derivatives and copolymers thereof.

An exemplary electroluminescent polymer is an arylamine-substituted poly(arylene-vinylene) polymer that has the general structure of formula (I) below:

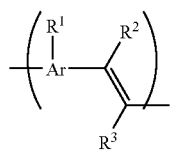

wherein: Ar is arylene, heteroarylene, substituted arylene or substituted heteroarylene containing one to three aromatic rings;

$R^1$ is the arylamine substituent and is of the formula —$Ar^1$—$N(R^4R^5)$ wherein $Ar^1$ is as defined for Ar and $R^4$ and $R^5$ are independently hydrocarbyl, substituted hydrocarbyl, heteroatom-containing hydrocarbyl, or substituted heteroatom-containing hydrocarbyl; and $R^2$ and $R^3$ are independently selected from the group consisting of hydrido, halo, cyano, hydrocarbyl, substituted hydrocarbyl, heteroatom-containing hydrocarbyl, and substituted heteroatom-containing hydrocarbyl, or $R^2$ and $R^3$ may together form a triple bond.

Other moieties may be as follows:

Ar may be a five-membered or six-membered arylene, heteroarylene, substituted arylene or substituted heteroarylene group, or may contain one to three such groups, either fused or linked. Preferably, Ar is comprised of one or two aromatic rings, and is most preferably comprised of a single aromatic ring that is five-membered or six-membered arylene, heteroarylene, substituted arylene or substituted heteroarylene. $Ar^1$, the arylene linking moiety in the arylamine substituent, is defined in the same way.

The substituents $R^2$ and $R^3$ are generally hydrido but may also be halo (particularly chloro or fluoro) or cyano, or substituted or unsubstituted alkyl, alkoxy, alkenyl, alkynyl, aryl and heteroaryl.

$R^4$ and $R^5$ may the same or different and, as noted, are hydrocarbyl, substituted hydrocarbyl, heteroatom-containing hydrocarbyl, or substituted heteroatom-containing hydrocarbyl. For example, $R^4$ and $R^5$ may be alkyl, alkoxy-substituted alkyl, polyether-substituted alkyl, nitro-substituted alkyl, halo-substituted alkyl, aryl, alkoxy-substituted aryl, polyether-substituted aryl, nitro-substituted aryl, halo-substituted aryl, heteroaryl, alkoxy-substituted heteroaryl, polyether-substituted heteroaryl, nitro-substituted heteroaryl, halo-substituted heteroaryl, and the like. In certain embodiments the substituents are aryl, e.g., phenyl, alkoxy-substituted phenyl (particularly lower alkoxy-substituted phenyl such as methoxyphenyl), polyether-substituted phenyl (particularly phenyl substituted with a —$CH_2$ ($OCH_2CH_2$)$_n$$OCH_3$ or —($OCH_2CH_2$)$_2$$OCH_3$ group where n is generally 1 to 12, preferably 1 to 6, most preferably 1 to 3), and halo-substituted phenyl (particularly fluorinated or chlorinated phenyl).

Another exemplary electroluminescent polymer material that is described in U.S. Pat. No. 6,414,104, is an arylamine-substituted poly(arylene-vinylene) polymer that contains monomer units having the general structure of formula (II) as follows:

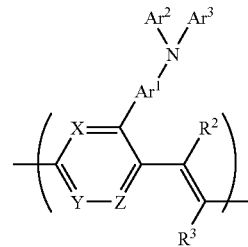

Wherein: X, Y and Z are independently selected from the group consisting of N, CH and $CR^6$ wherein $R^6$ is halo, cyano, alkyl, substituted alkyl, heteroatom-containing alkyl, aryl, heteroaryl, substituted aryl, or substituted heteroaryl, or wherein two $R^6$ moieties on adjacent carbon atoms may be linked to form an additional cyclic group;

$Ar^1$ is as defined above;

$Ar^2$ and $Ar^3$ are independently selected from the group consisting of aryl, heteroaryl, substituted aryl and substituted heteroaryl containing one or two aromatic rings; and $R^2$ and $R^3$ are as defined above.

In formula (I) above, the polymer is a poly(phenylene vinylene) derivative when X, Y and Z are all CH. When at least one of X, Y and Z is N, the aromatic ring will be, for example, substituted or unsubstituted pyridinyl, pyridazinyl, pyrimidinyl, pyrazinyl, 1,2,4-triazinyl, or 1,2,3-triazinyl. For instance, one of X, Y and Z may be CH and the other two may be either CH or $CR^6$, wherein $R^6$ may be a heteroatom-containing alkyl, for instance, alkoxy, or a polyether substituent —$CH_2$($OCH_2CH_2$)$_n$$OCH_3$ or —($OCH_2CH_2$)$_n$$OCH_3$ group where n is may be 1 to 12, for instance, 1 to 6, such as 1 to 3.

The polymer may be a homopolymer or a copolymer with at least one additional type of monomer unit. Preferably, if the polymer is a copolymer, the additional monomer units are also arylene-vinylene monomer units, for example having the structure of Formula (III):

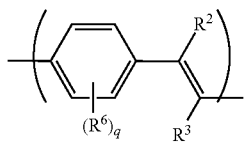

wherein $R^2$, $R^3$ and $R^6$ are as defined previously and q is an integer in the range of zero to 4 inclusive.

Examples of specific polymers having the structure of formula (I) are poly(2-(4-diphenylamino-phenyl)-1,4-phenylene vinylene and poly(2-(3-diphenylaminophenyl)-1,4-phenylene vinylene.

Examples of specific polymers disclosed in U.S. Pat. No. 6,414,104 are poly(2-(4-diphenylamino-phenyl)-1,4-phenylene vinylene and poly(2-(3-diphenylaminophenyl)-1,4-phenylene vinylene.

Electroluminescent polymers appropriate for use in this invention are also described in U.S. Pat. Nos. 6,723,828, 6,800,722, and 7,098,297, both of which are incorporated by reference herein. In those referenced patents there is disclosed a conjugated polymer containing monomer units having the structure of formula (IV):

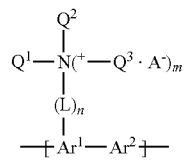

Wherein: $Ar^1$ and $Ar^2$ are independently selected from the group consisting of monocyclic, bicyclic and polycyclic arylene, heteroarylene, substituted arylene and substituted heteroarylene groups;

L is alkylene, alkenylene, substituted alkylene, substituted alkenylene, heteroalkylene, heteroalkenylene, substituted heteroalkylene, substituted heteroalkenylene, arylene, heteroarylene, substituted arylene or substituted heteroarylene;

m is zero or 1;

n is zero or 1;

$Q^1$ and $Q^2$ are independently selected from the group consisting of H, aryl, heteroaryl, substituted aryl, substituted heteroaryl, alkyl, and substituted alkyl, and $Q^3$ is selected from the group consisting of alkyl and substituted alkyl, with the proviso that when m is 1, $Q^1$ and $Q^2$ are other than H; and $A^-$ is a negatively charged counterion.

The electroluminescent material may also include blends of polymers within formula (IV) with other polymers, as well as a variety of copolymers.

Accordingly, in view of the above, in certain embodiments, an electroluminescent device of the subject invention includes a substrate, a hole-injection electrode layer, a dielectric layer, a cavity, an electroluminescent layer, and an electron-injection electrode layer. The hole-injection electrode layer may be positioned above the substrate. The dielectric layer may be positioned above the hole-injection layer. The cavity may extend through both the hole-injection electrode layer and the dielectric layer. The electroluminescent layer may be positioned in the cavity and is in contact with the hole-injection electrode layer and the dielectric layer. Additionally, the electron-injection electrode layer is positioned above the cavity, is in contact with the electroluminescent material, and is configured for directing light through the substrate. For instance, in certain embodiments, because of its non-transparent characteristics and its positioning above the cavity, the electron-injection electrode layer is configured so as to direct light generated within the electroluminescent material within the cavity out of the cavity (e.g., out of the bottom of the cavity) and through the substrate. In certain embodiments, the position of the hole-injection and electron-injection electrode layers is reversed, such that the electron-injection layer is positioned immediately above the substrate and the cavity extends through the electron-injection layer.

In certain embodiments, an electroluminescent device of the subject invention includes a substrate, a hole-injection electrode layer, a dielectric layer, an electron-injection electrode layer, an electroluminescent layer, and a cavity. The hole-injection electrode layer is positioned above the substrate, the dielectric layer is positioned above the hole-injection layer, and the electron-injection electrode layer is positioned above the dielectric layer. Additionally, the electroluminescent layer is interposed between the hole-injection electrode layer and the electron-injection electrode layer, and the cavity, which also includes a portion of the electroluminescent material, extends through the dielectric layer. In certain embodiments, the position of the hole-injection and electron-injection electrode layers is reversed, such that the electron-injection layer is positioned immediately above the substrate and the hole-injection layer is positioned above the electroluminescent layer and cavity.

In certain embodiments, an electroluminescent device of the subject invention includes a substrate, a hole-injection electrode layer, a dielectric layer, a cavity, and an electron-injection electrode layer. The hole-injection electrode layer is positioned above the substrate and the dielectric layer is positioned above the hole-injection layer. A cavity is included, wherein the cavity includes a plurality of interior surfaces, such as a surface that includes a portion of the hole-injection electrode layer and a surface that includes a portion of the dielectric layer (i.e., a plurality of surfaces make up the bounds of the cavity, which surfaces include a portion of the hole-injection electrode layer and a portion of the dielectric layer). An electroluminescent layer is also included, wherein the electroluminescent layer is positioned in (e.g., entirely within), the cavity and is in contact with the hole-injection electrode layer surface and the dielectric layer surface of the cavity. Additionally, an electron-injection electrode layer is also present, wherein the electron-injection electrode layer is in contact with the electroluminescent layer and is positioned above and spans across the cavity. In certain embodiments, the position of the hole-injection and electron-injection electrode layers is reversed, such that the electron-injection layer is positioned immediately above the substrate and the hole-injection layer is positioned above the electroluminescent layer and spans across the cavity.

In certain embodiments, a device of the subject invention includes both a hole-injection layer and an anode layer that make up two separate layers. In certain embodiments, a further hole transport layer is provided. In certain embodiments, a device of the subject invention includes both an electron-injection layer and a cathode layer that make up two separate layers. In certain embodiments, a further electron transport layer is provided.

Figure 9:
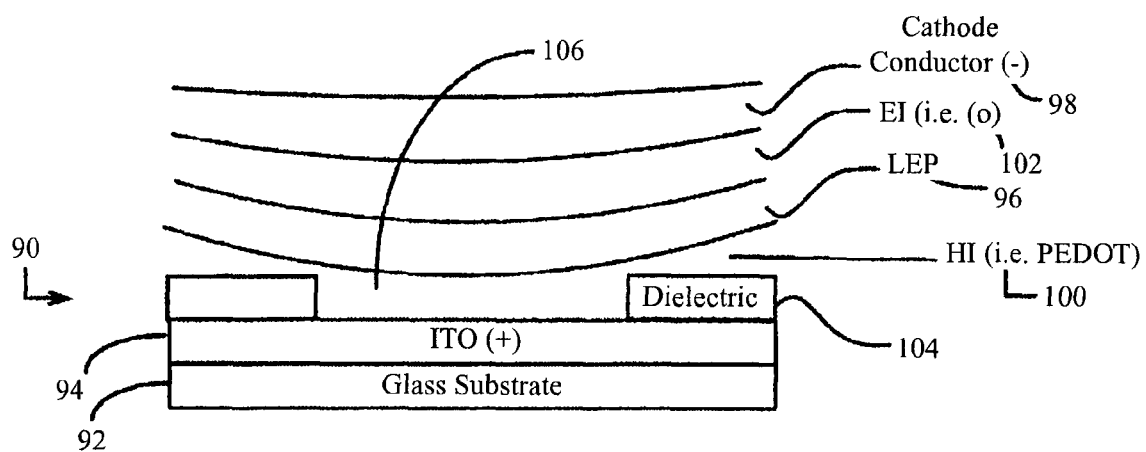
FIG. 9 schematically depicts an exemplary cavity containing polymeric OLED electroluminescent device in accordance with the subject invention.

For instance, in certain embodiments as set forth in FIG. 9, an electroluminescent device of the subject invention comprises a cavity containing organic light-emitting diode (OLED), which as described above, includes multiple layers of organic thin films positioned that are sandwiched between two electrodes, an anode and a cathode. Based on the molecular weight of the organic materials used, an COLED of the invention may be a polymeric cavity containing OLED (or cPLED), e.g., if the organic active layers are made up of polymer materials, or a small molecular cavity containing OLED (or SMOLED) if the organic layers are made up of small molecules.

Accordingly, a cPLED (90) of the subject invention may additionally include two organic layers: a hole-injection (HI) layer (100) and an emissive layer (96). The HI layer (100) may include a conductive polymer, such as poly(3,4-ethylenedioxythiophene)poly(styrenesulfonate) or (PEDOT:PSS, sometimes simplified as PEDOT), which may be deposited on a dielectric layer (104) and may be partially deposited on an anode (94) layer (for instance, an anode layer that partially bounds a cavity), which anode layer (e.g., indium-tin oxide layer) is positioned above a substrate (92). The emissive layer (96) may be a light-emitting polymer (LEP) layer deposited on top of the HI layer (100). As shown in FIG. 9, the LEP layer (96) is contained within a cavity (106), wherein the cavity (106) is bounded on its sides by a dielectric layer (104) and on its bottom by the hole-injection layer (100), which forms a layer on top of the anode layer (94). An electron injection layer may then be deposited on top of the LEP layer (96) and a cathode (98) layer may be deposited on top of the electron-injection layer (102), e.g., by thermal evaporation. Accordingly, a suitable cathode layer may also include an electron-injection (EI) layer (102) (which may be ultra thin, e.g., ranging from several to hundreds of Å, layer of low work function materials, such as Ca, Li, LiF, Mg, Ba, or their alloys) and may be capped by a thin film (for instance, ranging from several hundreds to 2000 Å) of a stable metal such as Al or Ag to provide the necessary electrical conductivity (not shown).

Figure 10:
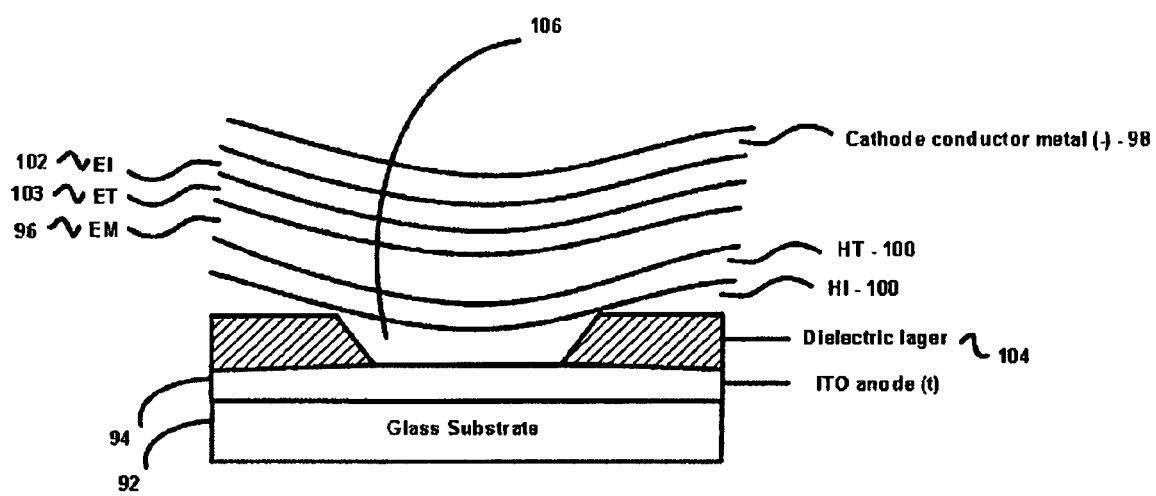
FIG. 10 schematically depicts an exemplary cavity containing small molecule OLED electroluminescent device in accordance with the subject invention.

In certain embodiments, as set forth in FIG. 10, an electroluminescent device of the subject invention comprises a cSMOLED (sometimes referred to as cOLED) (100), which may include more than two organic layers: a hole-injection (HI) layer (100), a hole transportation (HT) layer (101), one or more emissive (Em) layer(s) (96), an electron transportation (ET) layer (103), and a electron-injection (EI) layer (102). These organic layers may be sandwiched between two electrodes, such as an anode (94) positioned above a substrate (93) and a cathode (98).

As shown in FIG. 10, the emissive (Em) layer (96) is contained within a cavity (106), wherein the cavity (106) is bounded on its sides by a dielectric layer (104) and on its bottom by the hole-injection layer (100), which forms a layer on top of the anode layer (94). A hole transport layer (101) is positioned on the top of the hole-injection layer (100). The emissive layer (96) is positioned on top of the hole transport layer (101) and an electron transport layer (103) is positioned on top of the EM layer (96). An electron-injection layer (102) may then be positioned on top of the electron transport layer (103). The cathode (98) layer (e.g. metal conductor layer) may then be positioned above the electron-injection layer (103).

In some cases, an additional hole blocking and/or electron blocking layer is also used to optimize device performance (not shown). Unlike polymer materials that can be processed from solution, small molecules may be deposited via vacuum evaporation. In certain embodiments, the configuration of the cathode is very similar to that used in cPLED, although the actual materials selected for the cathode may be determined by the property of the organic material that is in direct physical contact with the cathode.

Methods of Fabricating an Electroluminescent Device

In one aspect, the subject invention provides a method for forming the above described electroluminescent device. In certain embodiments, the method involves first providing a layered structure on a substrate, wherein the layered structure includes a hole-injection electrode layer and an electron-injection electrode layer, and may include a dielectric layer interposed there between. The layered structure includes a cavity, which cavity extends through the dielectric layer (if included) and may extend through the hole-injection electrode layer, in such a manner that an interior cavity surface is exposed, wherein the interior cavity surface includes a dielectric region (if included) and a hole-injection electrode region. The method further involves coating the interior cavity surface with an electroluminescent coating material to provide the electroluminescent material electrical contact with the hole-injection and electron-injection electrode regions.

In the methods of fabricating an electroluminescent device of the subject invention, a variety of techniques may be used to deposit each layer on to the substrate and/or a previously deposited layer. Such deposition techniques include, but are not limited to, evaporation, sputtering, chemical vapor deposition, electroplating, spin coating, screen printing and other techniques familiar to one of ordinary skill in the art of semiconductor fabrication. In addition, it is to be noted that the deposition technique may be chosen according to the layer material. For example, metals may be deposited by evaporation, sputtering, electroplating, chemical vapor deposition, etc.

In order to achieve a well-controlled thickness for each layer, vacuum deposition technology may be employed. Such vacuum processes include, but are not limited to, cathodic arc physical vapor deposition, electron-beam evaporation, enhanced arc physical vapor deposition, chemical vapor deposition, magnetronic sputtering, molecular beam epitaxy, combinations of such techniques and a variety of other techniques known to one of ordinary skill in the art. One of ordinary skill in the art will also recognize that chemical vapor deposition is particularly suited for forming dielectric layer materials such as silicon nitride.

Chemical vapor deposition usually involves heating a substrate surface to a sufficiently high temperature to decompose gaseous organic species to form the desired film. Such heating may preclude the use of certain substrates which are adversely affected by the heat, such as certain plastics. Physical vapor deposition, on the other hand, does not necessarily exclude plastics as a substrate. In addition, some substrate heating may be employed in physical vapor deposition to promote film adhesion. It is also to be noted that vacuum deposition may be required if a reactive metal such as magnesium or calcium is used as an electrode layer material.

Figure 11:
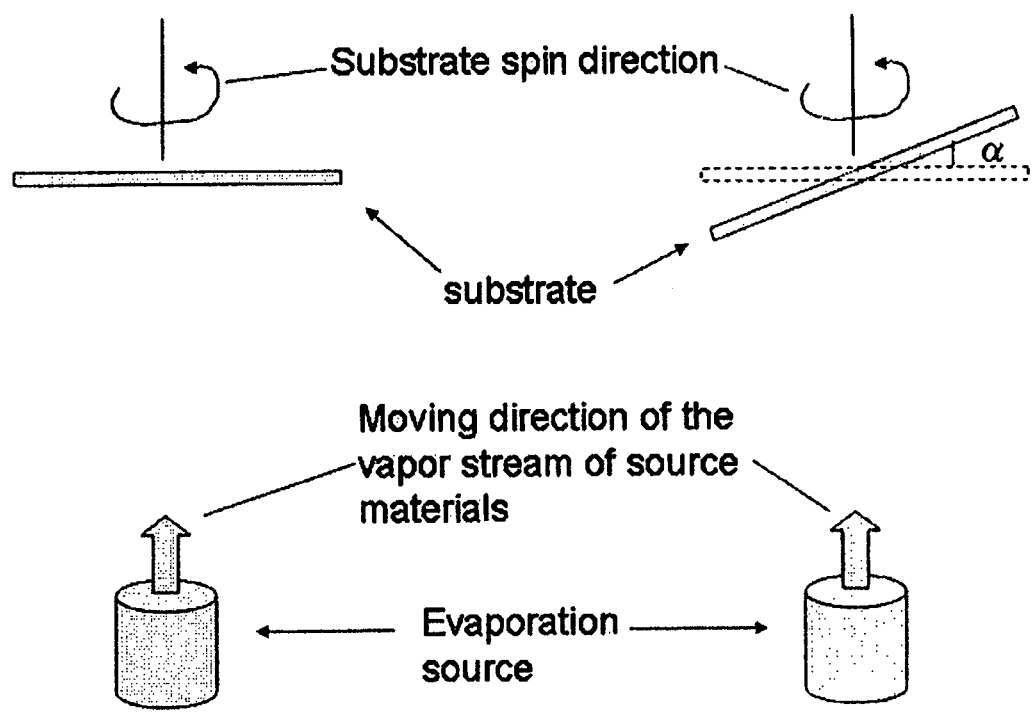
FIG. 11 schematically depicts an exemplary method for forming a cavity in a OLED electroluminescent device in accordance with the subject invention.

For instance, in certain embodiments, as set forth in FIG. 11, the organic layers and the cathode of a COLED can be produced using the same process as those developed for the traditional OLEDs. That is, for a polymeric COLED, an HI (e.g., PEDOT) and an LEP layer(s) can be spin-coated followed by vacuum deposition of a regular cathode, such as Ca/Al. Similarly, a small molecular COLED can be produced via the established vacuum depositions process, although in certain circumstances (e.g., when the substrate uses one of the structures shown in FIGS. 2, 4, 6) an angular deposition (FIG. 11) maybe used. In the case of small molecule COLED, the deposition sequence can be either the same as a regular OLED or can be reversed. That is, either in the sequence of "HI/HT/Em/ET/EI/cathode metal" (metal layer on substrate functions as the anode) or "EI/ET/Em/HT/HI/anode metal" (metal layer on substrate function as the cathode).

A wide variety of methods may be used to form the cavity. A cavity may be formed, for example, with the aid of nanoimprinting. Alternatively, a cavity may be formed by means of a wet or dry etch process. Photoresist may be used in etching to define the location of the cavity. The etchant may be a gas, liquid, solid or a combination thereof or require an additional energy source such as electromagnetic radiation or electrons. Ion milling or reactive ion etch, for example, may be used.

The electroluminescent material may be applied to the interior cavity surface through any of a number of techniques that depend on the material properties of the electroluminescent material itself. When the electroluminescent material is polymeric in nature, the coating material may be formed in situ on the cavity surface or applied by solvent casting, spin coating, spray coating, printing or other techniques to the cavity surface.

As the cavity surface may easily oxidize or otherwise become contaminated before the electroluminescent coating material is applied, surface treatments may be employed immediately prior to the application of the electroluminescent material. For example of surface treatments include, but are not limited to, drying cleaning (e.g., exposure to plasma), wet etching, solvent cleaning. In addition, the cavity surface may be modified by attaching a surface-modifying moiety to provide for improved adhesion between the cavity surface and the electroluminescent coating. Cavity surface modification may also involve providing a material or coating that enhances hole and/or electron transport between the electrodes and the electroluminescent coating.

Collectively, FIG. 7 illustrates one method for forming an electroluminescent device as a layered structure on a substrate. FIG. 7A illustrates a suitable substrate (70) of the subject invention upon which a layered structure of the invention is to be deposited. FIG. 7B illustrates the deposition of a hole-injection electrode layer (72) on a substrate (70). FIG. 7C illustrates the deposition of a dielectric layer (74) on the hole-injection electrode layer (72). FIGS. 7D and 7E illustrate the formation of a cavity (80) through the dielectric and hole-injection electrode layers (72 and 74, respectively) by using a lithographic and/or etching technique. FIG. 7D illustrates the beginning of the formation of a cavity (80), in the layered structure after the etchant is applied to the layered structure. FIG. 7E illustrates a fully formed cavity (80), wherein the cavity (80) extends from opening (82) entirely through the layered structure and terminates at the substrate (70). The cavity (80) is bounded by a surface of the substrate (71), a surface of the hole-injection electrode region (73), and a surface of the dielectric region (75). While FIG. 7E illustrates that cavity (80) having a cylindrical shape can be formed, it is also possible to form cavities of other shapes (e.g., the side wall profile of the cavity may be tapered or rounded, so that the cavity is bounded not by walls at a 90° angle but rather at an angle that is less than 90°, for instance, an angle that is about 45° or less) by selective application of one or more isotropic or anisotropic etchants to the layered structure.

The etchant may be a gas, liquid, solid or a combination thereof or require an additional energy source such as electromagnetic radiation or electrons. That is, either dry (e.g., plasma or ion beam milling) or wet (e.g. chemical) etching techniques may be used. It should be evident that the etchant must be able to etch through at least one electrode material and the dielectric material in order to form the interior cavity surface having the hole-injection electrode region, the dielectric region and the electron-injection electrode region. Hence, the etching process may carried out using any suitable lithographic techniques generally known in the field of semiconductor processing such as stepper lithography, electron-beam lithography, laser interference lithography, nanoimprinting, and the like. One of ordinary skill in the art is capable of selecting and applying an etchant to form a cavity of desired geometry.

Figure 7A:
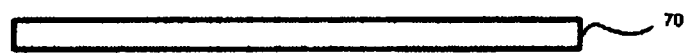
FIGS. 7A, 7B, 7C, 7D, 7E, 7F, and 7G collectively referred to as FIG. 7, illustrate a method for fabricating an electroluminescent device.
Figure 7B:
Figure 7C:
Figure 7D:
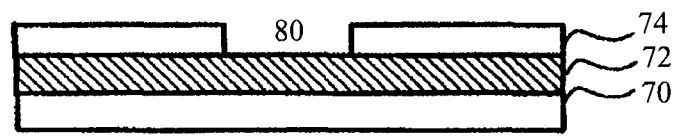
Figure 7E:
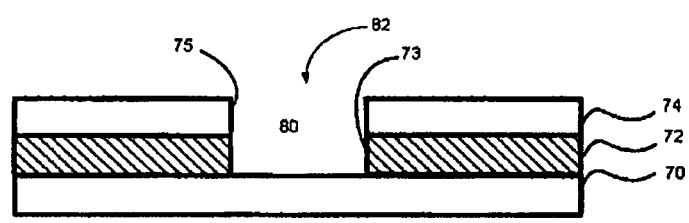
Figure 7F:
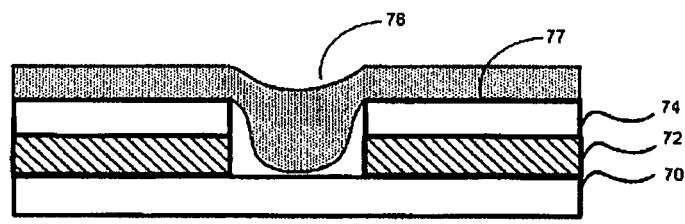

Once the cavity (80) has been formed, an electroluminescent material layer (76) may be applied to the interior cavity surfaces of the cavity (80) through any of a number of techniques that depend on the material properties of the electroluminescent material itself, so as to fill the cavity. For instance, when the coating material is polymeric in nature, the coating material may be formed in situ on the cavity surface or be applied by solvent casting, spin coating, spray coating, printing or other techniques to the cavity surface. FIG. 7F illustrates the application of an electroluminescent coating material (76) to the interior surface of the cavity (80) so as to achieve conformal contact between the coating material and the interior surface of the cavity.

The coating material (76) may be applied as a film over the exterior surface (77) of the dielectric layer (74) of the layered structure illustrated in FIG. 7F. As shown, a portion of the electroluminescent material (76) fills the cavity (80). However, such application of electroluminescent material may result in void space between the electroluminescent coating material and a surface of the cavity. The void may be eliminated by subjecting the coating material to heat and/or vacuum (or using a surface modifier), particularly when the coating material is a polymeric material.

The interior surface of the cavity may be modified before the electroluminescent material is applied. As the cavity surface may easily oxidize or otherwise become contaminated before the electroluminescent coating material is applied, surface treatments may be employed immediately prior to the application of the electroluminescent material. For example of surface treatments include, but are not limited to, drying cleaning (e.g., exposure to plasma), wet etching, solvent cleaning. In addition, the cavity surface may be modified by attaching a surface-modifying moiety to provide for improved adhesion between the cavity surface and the electroluminescent coating. Cavity surface modification may also involve providing a material or coating that enhances hole and/or electron transport between the electrodes and the electroluminescent coating.

Figure 7G:
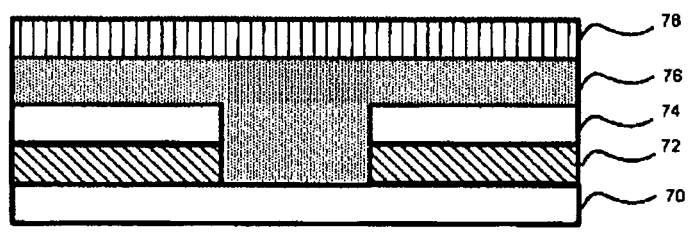
Figure 8A:
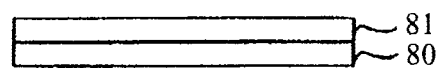
FIGS. 8A, 8B, 8C, 8D and 8E collectively referred to as FIG. 8, illustrate an alternative method for making a cavity-containing layered structure of a luminescent device.
Figure 8B:
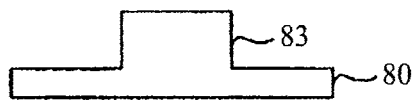
Figure 8C:
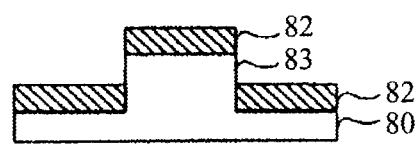
Figure 8D:
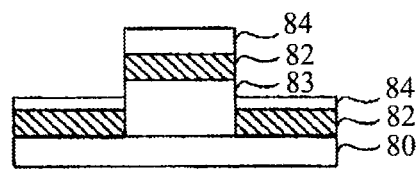
Figure 8E:
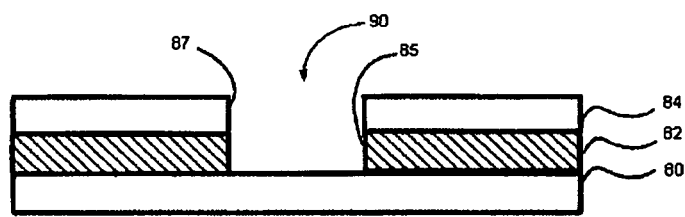

FIG. 7G illustrates the deposition of an electron-injection layer (78) on the electroluminescent material layer (76), thereby forming a layered structure. It is to be noted, that in certain embodiments, electroluminescent material (76) fills the cavity (80) but does not form an intermediary layer between the dielectric layer (74) and the electron-injection layer (78). Hence, in certain embodiments the electron-injection layer (78) is deposited directly onto the dielectric layer (74) and covers the cavity (80) and the electroluminescent material layer (76), which at least partially fills the cavity (80).

Further, it is to be noted that the order of layer deposition can be reversed, i.e., the electron-injection electrode layer may be the initial layer deposited on the substrate. Hence, the electron-injection electrode layer can be deposited before or after the hole-injection layer and dielectric layer (if included) are deposited, the cavity has been formed and the electroluminescent layer has been deposited. Accordingly, either the electron-injection layer or hole-injection layer may form a layer the bounds, spans across and covers the cavity and/or any previously deposited layers (such as the electroluminescent layer, the dielectric layer, and the like). Furthermore, one or more additional layers may also be deposited, such as hole-injection and/or hole transport layer or an electron-injection and/or electron transport layer. In such an instance, the hole-injection and/or hole transport layers should be deposited so as to be in contact with one another and/or in contact with the anode layer; and the electron-injection and/or electron transport layers should be deposited so as to be in contact with one another and/or in contact with the cathode layer.

FIG. 8 illustrates another method in which the electroluminescent device may be formed. FIGS. 8A and 8B illustrate the formation of a sacrificial member in the shape of a desired cavity of the layered structure of a luminescent device. In FIG. 8A, a photoresist (81) is deposited onto a substrate (80). The resist is then developed in a pattern, as illustrated in FIG. 8B, to provide a sacrificial member (83) in the shape of a desired cavity. FIG. 8C illustrates the deposition of a hole-injection layer (82) on the substrate (80) and around the sacrificial member (83). Similarly, FIG. 8D illustrates the deposition of a dielectric layer (84) on the hole-injection layer (82) and around the sacrificial member (83) When the sacrificial member is removed, a layered structure is formed having a cavity (90) through the hole-injection and the dielectric layer (82). As shown in FIG. 8E, the interior surface of the cavity (90) of the layered structure is composed of a hole-injection electrode region (85) and a dielectric layer region (87). The interior surface of the cavity of the layered structure is then coated with an electroluminescent coating material and an electron-injection electrode layer is deposited on the layered structure as described above.

Utility

In another aspect, the subject invention is directed to the use of the above described electroluminescent device in the production of an electroluminescent lighting or display device, wherein the electroluminescent display device includes a layered structure, as described above, a plurality of cavities each extending through a portion of the layered structure such that each cavity has an interior cavity surface that includes a hole-injection electrode region and a dielectric region. The layered structure is adjacent to a suitable substrate (e.g., a transparent substrate), the electroluminescent material is in electrical contact with the hole-injection electrode and dielectric regions of each interior cavity surface, and the electron-injection electrode layer is positioned above the cavities and in electrical contact with the electroluminescent material contained in the plurality of cavities.

Preferably, the plurality of cavities is arranged in an array. The cavities may be of different sizes and/or distributed regularly or irregularly. A possible reason for having irregularly sized or distributed cavities is that cavity size and distribution may influence the emission spectrum of radiation emitted by the electroluminescent material in the cavity.

A red, green and/or blue pattern for color display applications may also be provided. For instance, the cavities may contain an electroluminescent material that emits an electromagnetic radiation of a particular wavelength (e.g., a wavelength corresponding to a particular color). Specifically, the layered structure may be fabricated in such a manner that the electroluminescent material of the cavities emit colors when excited, wherein the colors emitted from the cavities correspond to subpixels of the display. For example, the cavities can be grouped into regions of three (e.g., a trimer), wherein each trimer forms a pixel, each pixel includes three sub-pixels, and each sub-pixel contains an electroluminescent material that emits electromagnetic radiation of a red, green, or blue wavelength.

In certain embodiments, colored filers may be used to produce a colored display. In this embodiment, as set forth in FIG. 12 a and b, a COLED is set forth, wherein the COLED includes a filter (120), which may be a red, green, blue, white, clear, or other color filter. The COLED also includes a substrate (122), an anode (124), an organic layer (126), and a cathode layer (130), additional layers (not shown) may also be included, such as a hole-injection and/or transport layer and/or an electron-injection and/or transport layer.

Figure 12:
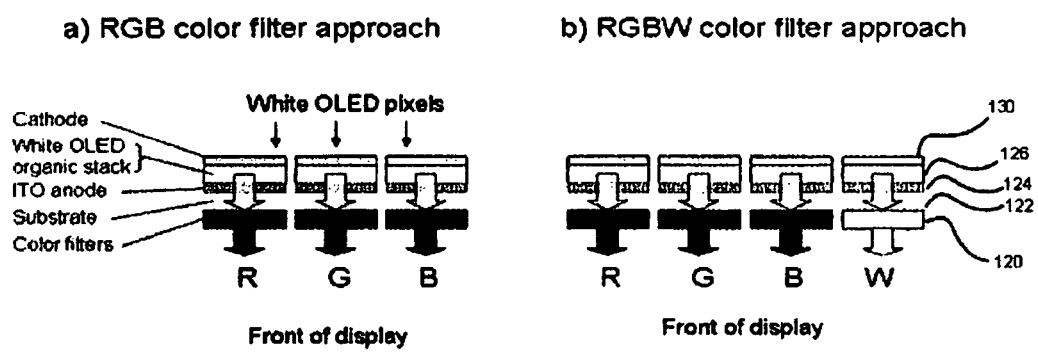
FIG. 12 schematically depicts an exemplary method for forming a color display in an cavity containing OLED electroluminescent device in accordance with the subject invention.

Accordingly, as set forth in FIG. 12a, a COLED emitting white light may be used for all pixels. In other words, all the sub pixels may include the same COLED emitting white light. Red (R), green (G), and blue (B) color sub-pixels may be achieved by using color filters. In this approach, since each sub-pixel only makes use of one of the three components of the white light emitted by the pixel, the efficiency of the display may be reduced. This efficiency may be improved by using a 4-pixels approach, the RGBW approach set forth in FIG. 12 b. In this approach, an additional white sub-pixel without using a color filter is introduced. Since this pixel makes use effectively of all the light emitted, the total efficiency of the display may be increased.

Hence, each pixel includes at least three sub-pixels, wherein each sub-pixel emits one of a red, green or blue light, so that each pixel includes all of a red, green, and blue sub-pixel. Typically, each sub-pixel may include tens, hundreds or thousands of sub-pixels. Accordingly, each cavity may be filled with an electroluminescent material capable of emitting one of these three colors or be filled with a material that emits white light but be associated with a colored filter. In this manner, the electroluminescent devices of the invention may be used to produce a color display device.

Further, one or more emission modifiers may be added to the electroluminescent material in each cavity. Suitable emission modifiers include, but are not limited to, organic and organometallic luminescent dyes such as 2-methyl-8-hydroquinoline aluminum, 8-hydroquinoline aluminum, coumarins, acridines, quinolone, carbostyryls, fluorols, phenoxazenes, rhodamines, and fluoresceins. In selecting a suitable light-emissive dye, one or ordinary skill in the art will recognize that color and luminescent efficiency are two important factors which can be determined through routine experimentation. Moreover, emission modifiers may themselves be polymeric electroluminescent materials. For example poly(1,4-phenylene vinylene), poly(2-methoxy-5-(2-ethylhexoxy)-1,4-phenylene vinylene) and poly(9,9-dioctyl-2,7-fluorene) may be adapted to emit green, orange-red and blue light, respectively. Other suitable modifiers include, but are not limited to, pigments and light absorbing dyes such as phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177. These modifiers can be added either by employing ordinary lithographic techniques or by using an inkjet technology to selectively deposit an emission modifier at desired cavities. If a photocurable photoresist technique is employed in order to modify an electroluminescent polymeric material, it may be desirable to crosslink the polymeric material in order to dimensionally stabilize the polymeric material and to prevent damage to it.

In an array or other arrangement of electroluminescent devices, of the subject invention, the activation of the electroluminescent material in each of the plurality of individual cavities (or groups of such cavities) may be under a suitable electronic control such that by turning the devices "on" and "off" to varying degrees it is possible to form a complete color image. This may be achieved, for example, by patterning the hole-injecting electrode layer and/or the election-injecting electrode layer and/or by creating additional patterned layers which suitably connect portions of these layers to drive electronics.

Accordingly, as can be seen with reference to the above, embodiments of the subject invention exhibit several advantages over other art in the field. For instance, in various cavity containing LED devices known in the field, the organic light emitting (e.g., emissive) layer is entirely contained within the cavity, this is not a requirement of various embodiments of the present invention. Additionally, multiple organic layers may be employed in various embodiments of the present invention, where as in various cavity containing LED devices known in the field this is not the case.

Further, with respect to various embodiments of the present invention, both "top" and "bottom" emitting configurations are available, where as in various cavity containing LED devices known in the field, only top emitting configurations are available. Furthermore, given the adaptability of various configurations of the devices of the present invention, the use of an air-stable cathode is not necessary. Rather, cathodes developed for conventional OLED can be used. This is contrary to in various cavity containing LED devices known in the field wherein an air-stable cathode is necessary and cathodes developed for conventional OLEDs can not be used. Hence, a device of the present invention may be compatible with multi-layer small molecule OLEDs as well as polymeric OLEDs, and various cavity containing LED devices known in the field are not compatible with multi-layer small molecule OLEDs.

Additionally, various cavity containing LED devices known in the field are not compatible with fabrication processes developed for conventional OLED, whereas in certain embodiments of the present invention the devices to be manufactured are fully compatible with fabrication processes developed for conventional OLED. For instance, with respect to certain embodiments of a device of the present invention, the thickness of the dielectric layer can vary in a larger range without significantly affecting the device operating voltage and device fabrication yield, because of this a defect in the dielectric layer may not result in failure of device. However, with respect to various cavity containing LED devices known in the field, the thickness of the dielectric layer is limited within a small range (approximately 100±20 nm) to insure optimal device performance, plus the dielectric layer must defect-free as defects may result in device failure.

Variations on of the present invention will be apparent to those knowledgeable in the field of electroluminescent devices. For example, while the layered structure having a cavity may be formed by ordinary lithographic and etching techniques, other techniques such as laser ablation may also be employed, either as an alternative or in addition, to remove material from the layered structure. The present invention also allows the incorporation of known aspects of electroluminescent display device design such as interdigitated electrodes. It should also be noted that additional layers may be formed between each layer to promote interlayer adhesion or to improve electrical properties such as electron and/or hole transport.

One of ordinary skill in the art will also recognize other considerations such as packaging and electronics are also an essential consideration for any display. Reactive metals and luminescent materials used in these displays are subject to attack by moisture and air. Therefore, the displays should be packaged accordingly. Such packaging may involve lamination or other technologies known in the art. Device electronics may include commercially available systems appropriate to any desired display design.

While the invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the invention. All such modifications are intended to be within the scope of the claims appended hereto.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

What is claimed is:

1. An electroluminescent device, the device comprising:
   (a) a transparent substrate;
   (b) a hole-injection electrode layer positioned above the substrate;
   (c) a dielectric layer positioned above the hole-injection electrode layer;
   (d) an electron-injection electrode layer positioned above dielectric layer and configured for directing light through the substrate;
   (e) an electroluminescent layer interposed between the hole-injection electrode layer and the dielectric layer; and
   (f) a cavity extending through the dielectric layer and the hole-injection electrode layer, wherein the electron-injection electrode layer and the substrate span the cavity, and the electroluminescent layer fills the cavity and contacts the hole-injection electrode layer on the side of the cavity and contacts the substrate at the bottom of the cavity.

2. The electroluminescent device according to claim 1, further comprising an anode and a cathode, and the anode is in contact with the hole-injection electrode layer, and the cathode is in contact with electron-injection electrode layer.

3. The electroluminescent device according to claim 1, wherein the hole-injection electrode layer comprises a material selected from the group consisting of gold, copper, nickel, palladium, platinum, chromium, molybdenum, tungsten, manganese, cobalt, metal oxides, conducting polymers and combinations and alloys thereof.

4. The electroluminescent device according to claim 1, wherein the dielectric layer comprises a high-resistivity material having an electrical resistivity of no less than about $10^8$ ohm-cm.

5. The electroluminescent device according to claim 1, wherein the electroluminescent layer comprises an electroluminescent polymer comprising a conjugated polymer selected from the group consisting of polyparaphenylenes; polythiophenes; polyphenylenevinylenes; arylamine-substituted polyarylenevinylenes; polythienylvinylenes; polyfluorenes; and 1,3,4-oxadiazole-containing polymers.

6. The electroluminescent device according to claim 1, wherein the electroluminescent layer comprises an electroluminescent polymer that is an arylamine-substituted polyarylenevinylene.

7. The electroluminescent device according to claim 1, wherein the electroluminescent material comprises an inorganic non-polymeric electroluminescent molecule.

8. The electroluminescent device according to claim 1, wherein the electroluminescent material comprises an inorganic non-polymeric electroluminescent molecule that is tris (8-hydroxyquinolinato) aluminum or perylene.

9. The electroluminescent device according to claim 1, wherein the electron-injection electrode layer comprises a low work function metal selected from the group consisting of aluminum, barium, barium beryllium, boron, calcium, gallium, indium, lithium, magnesium, strontium, and combinations and alloys thereof.

10. The electroluminescent device according to claim 1, wherein at least one electrode layer has a thickness of about 200 to about 2000 angstroms.

11. The electroluminescent device according to claim 1, wherein the cavity is axially symmetric and has a constant cross-sectional area along the cavity axis.

12. The electroluminescent device according to claim 1, wherein the cavity is axially symmetric and has a smaller cross-sectional area at the dielectric layer than at the hole-injection electrode layers.

13. The electroluminescent device according to claim 1, further comprising an insulating layer interposed between the substrate and the hole-injection electrode layer.

14. The electroluminescent device according to claim 1, wherein the substrate is detachable and is configured to prevent reflection.

15. The electroluminescent device according to claim 1, further comprising a hole transport layer and an electron transport layer.

16. The electroluminescent device according to claim 1, wherein the substrate comprises a roughened surface.

17. The electroluminescent device according to claim 1, wherein the cavity is axially symmetric, the device comprises a plurality of cavities, and the substrate is configured to prevent reflection.

18. The electroluminescent device according to claim 1, wherein the cavity has a diameter of 1 to 12 micrometers.

19. An electroluminescent display comprising the electroluminescent device of claim 1, wherein the cavity is one of a plurality of cavities.

20. An electroluminescent display comprising the electroluminescent device of claim 1, wherein the cavity is one of a plurality of cavities arranged in an array, and each cavity has a diameter of about 1 to 12 micrometers.

21. An electroluminescent display comprising the electroluminescent device of claim 1, wherein the cavity is one of a plurality of cavities, and the plurality of cavities is distributed irregularly.

22. An electroluminescent display comprising the electroluminescent device of claim 1, wherein the cavity is one of a plurality of cavities, the cavities are distributed irregularly, and the cavities are of different sizes.

23. An electroluminescent display comprising the electroluminescent device of claim 1, wherein the cavity is one of a plurality of cavities, and each of the cavities comprises an emission modifier.

24. An electroluminescent display comprising the electroluminescent device of claim 1, wherein the cavity is one of a plurality of cavities, and each of the cavities comprises an emission modifier selected from:
poly(1,4-phenylene vinylene), poly(2-methoxy-5-(2-ethylhexoxy)-1,4-phenylene vinylene) and poly(9,9-dioctyl-2,7-fluorene).

25. An electroluminescent display comprising the electroluminescent device of claim 1, wherein the cavity is one of a plurality of cavities, and each of the cavities comprises an emission modifier selected from:
2-methyl-8-hydroquinoline aluminum, 8-hydroquinoline aluminum, coumarins, acridines, quinolone, carbostyryls, fluorols, phenoxazenes, rhodamines, and fluoresceins.

26. An electroluminescent display comprising the electroluminescent device of claim 1, wherein the cavity is one of a plurality of cavities, and each of the cavities comprises an emission modifier selected from:
pigments and light absorbing dyes.

27. An electroluminescent device, the device comprising:
(a) a transparent substrate;
(b) a hole-injection electrode layer positioned above the substrate;
(c) a dielectric layer positioned above the hole-injection electrode layer;
(d) an electron-injection electrode layer positioned above the dielectric layer and configured for directing light through the substrate;
(e) an electroluminescent layer interposed between the hole-injection electrode layer and the dielectric layer; and
(f) a cavity extending through the dielectric layer, wherein the electron-injection electrode layer, the hole-injection electrode layer and the substrate span the cavity, and the electroluminescent layer fills the cavity and contacts the hole-injection electrode layer at the bottom of the cavity.

28. The electroluminescent device according to claim 27, wherein the hole-injection electrode layer is transparent.

29. The electroluminescent device according to claim 27, further comprising an anode and a cathode, and the anode is in contact with the hole-injection electrode layer, and the cathode is in contact with electron-injection electrode layer.

30. The electroluminescent device according to claim 27, wherein the hole-injection electrode layer comprises a material selected from the group consisting of gold, copper, nickel, palladium, platinum, chromium, molybdenum, tungsten, manganese, cobalt, metal oxides, conducting polymers and combinations and alloys thereof.

31. The electroluminescent device according to claim 27, wherein the dielectric layer comprises a high-resistivity material having an electrical resistivity of no less than about $10^8$ ohm-cm.

32. The electroluminescent device according to claim 27, wherein the electroluminescent layer comprises an electroluminescent polymer comprising a conjugated polymer selected from the group consisting of polyparaphenylenes; polythiophenes; polyphenylenevinylenes; arylamine-substituted polyarylenevinylenes; polythienylvinylenes; polyfluorenes; and 1,3,4-oxadiazole-containing polymers.

33. The electroluminescent device according to claim 27, wherein the electroluminescent layer comprises an electroluminescent polymer that is an arylamine-substituted polyarylenevinylene.

34. The electroluminescent device according to claim 27, wherein the electroluminescent material comprises an inorganic non-polymeric electroluminescent molecule.

35. The electroluminescent device according to claim 27, wherein the electroluminescent material comprises an inorganic non-polymeric electroluminescent molecule that is tris (8-hydroxyquinolinato) aluminum or perylene.

36. The electroluminescent device according to claim 27, wherein the electron-injection electrode layer comprises a low work function metal selected from the group consisting of aluminum, barium, barium beryllium, boron, calcium, gallium, indium, lithium, magnesium, strontium, and combinations and alloys thereof.

37. The electroluminescent device according to claim 27, wherein at least one electrode layer has a thickness of about 200 to about 2000 angstroms.

38. The electroluminescent device according to claim 27, wherein the cavity is axially symmetric and has a constant cross-sectional area along the cavity axis.

39. The electroluminescent device according to claim 27, wherein the cavity is axially symmetric and has a smaller cross-sectional area at the dielectric layer than at the hole-injection electrode layers.

40. The electroluminescent device according to claim 27, further comprising an insulating layer interposed between the substrate and the hole-injection electrode layer.

41. The electroluminescent device according to claim 27, wherein the substrate is detachable and is configured to prevent reflection.

42. The electroluminescent device according to claim 27, further comprising a hole transport layer and an electron transport layer.

43. The electroluminescent device according to claim 27, wherein the substrate comprises a roughened surface.

44. The electroluminescent device according to claim 27, wherein the cavity is axially symmetric, the device comprises a plurality of cavities, and the substrate is configured to prevent reflection.

45. The electroluminescent device according to claim 27, wherein the cavity has a diameter of 1 to 12 micrometers.

46. An electroluminescent display comprising the electroluminescent device of claim 27, wherein the cavity is one of a plurality of cavities.

47. An electroluminescent display comprising the electroluminescent device of claim 27, wherein the cavity is one of a plurality of cavities arranged in an array, and each cavity has a diameter of about 1 to 12 micrometers.

48. An electroluminescent display comprising the electroluminescent device of claim 27, wherein the cavity is one of a plurality of cavities, and the plurality of cavities is distributed irregularly.

49. An electroluminescent display comprising the electroluminescent device of claim 27, wherein the cavity is one of a plurality of cavities, the cavities are distributed irregularly, and the cavities are of different sizes.

50. An electroluminescent display comprising the electroluminescent device of claim 27, wherein the cavity is one of a plurality of cavities, and each of the cavities comprises an emission modifier.

51. An electroluminescent display comprising the electroluminescent device of claim 27, wherein the cavity is one of a plurality of cavities, and each of the cavities comprises an emission modifier selected from:
poly(1,4-phenylene vinylene), poly(2-methoxy-5-(2-ethylhexoxy)-1,4-phenylene vinylene) and poly(9,9-dioctyl-2,7-fluorene).

52. An electroluminescent display comprising the electroluminescent device of claim 27, wherein the cavity is one of a plurality of cavities, and each of the cavities comprises an emission modifier selected from:
2-methyl-8-hydroquinoline aluminum, 8-hydroquinoline aluminum, coumarins, acridines, quinolone, carbostyryls, fluorols, phenoxazenes, rhodamines, and fluoresceins.

53. An electroluminescent display comprising the electroluminescent device of claim 27, wherein the cavity is one of a plurality of cavities, and each of the cavities comprises an emission modifier selected from:
pigments and light absorbing dyes.

* * * * *